United States Patent
Cipolla et al.

(10) Patent No.: US 8,425,236 B2
(45) Date of Patent: Apr. 23, 2013

(54) TALL MEZZANINE CONNECTOR

(75) Inventors: Thomas M. Cipolla, Katonah, NY (US); Paul W. Coteus, Yorktown, NY (US); Takken Todd, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/108,955

(22) Filed: May 16, 2011

(65) Prior Publication Data

US 2012/0295453 A1 Nov. 22, 2012

(51) Int. Cl.
*H01R 12/00* (2006.01)
(52) U.S. Cl.
USPC .......................................................... 439/59
(58) Field of Classification Search .................... 439/59, 439/218, 61, 502, 631
See application file for complete search history.

(56) References Cited

U.S. PATENT DOCUMENTS

| | | | |
|---|---|---|---|
| 6,695,622 B2* | 2/2004 | Korsunsky et al. | 439/65 |
| 7,390,194 B1 | 6/2008 | Crippen et al. | |
| 7,407,387 B2 | 8/2008 | Johnescu et al. | |
| 7,420,819 B2 | 9/2008 | Yang et al. | |
| 7,425,137 B1 | 9/2008 | Sipe et al. | |
| 7,429,176 B2 | 9/2008 | Johnescu et al. | |
| 7,746,654 B2 | 6/2010 | Franz et al. | |
| 2007/0155193 A1* | 7/2007 | Kim | 439/59 |
| 2009/0004892 A1 | 1/2009 | Weber | |
| 2010/0184307 A1 | 7/2010 | Arai | |

* cited by examiner

*Primary Examiner* — Tulsidas C Patel
*Assistant Examiner* — Phuongchi Nguyen
(74) *Attorney, Agent, or Firm* — Thomas A. Beck; Daniel P. Morris

(57) ABSTRACT

A tall mezzanine connector which connects the substantial middle half of each of a pair of circuit cards positioned normal thereto. The mezzanine connector comprises a and a receptacle that includes wafers having electrical contact means at each end thereof for contacting contacts in the respective circuit cards, the wafers being held in place by an upper base member and a lower base member.

21 Claims, 18 Drawing Sheets

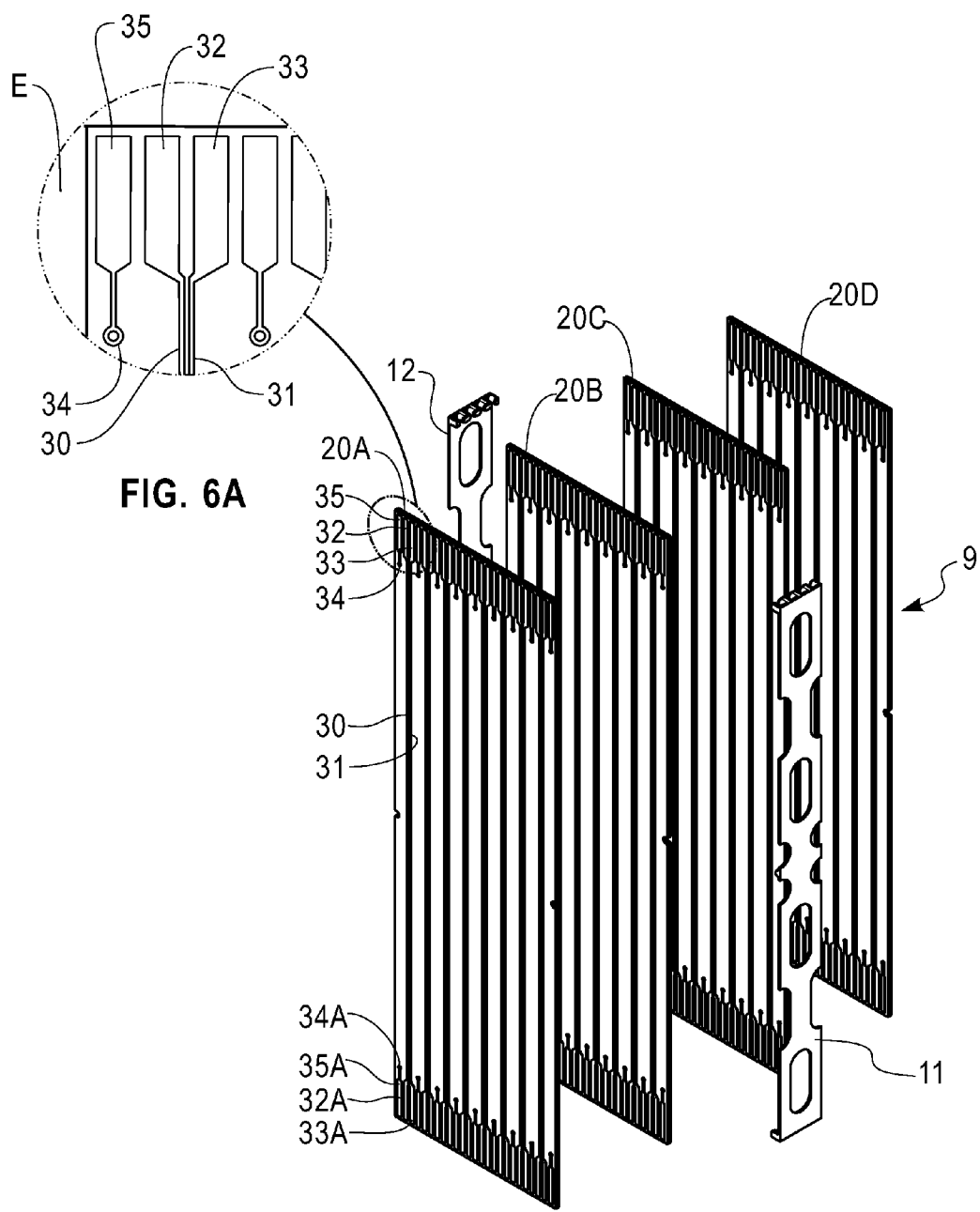

TALL MEZZANINE CONNECTOR

This application is a continuation-in-part of U.S. patent application 12/986,132 filed Jan. 6, 2011.

FIELD OF THE INVENTION

The invention relates to reliable, separable and dense electrical card-to-card connection technology that is used to make a plurality of electrical connections across the area of large circuit boards. More specifically, the invention relates to a tall, flexible mezzanine connector for parallel-mounted or normal positioned cards.

BACKGROUND OF THE INVENTION

The need for chip-to-chip communication bandwidth has tracked the increasing circuit density and computational power of Integrated Circuit (IC) chips. This increased bandwidth has been provided both by increasing the number of chip-to-chip interconnections and by increasing the data rate per interconnection. In computer networks, bandwidth is often used as a synonym for data transfer rate-the amount of data that can be carried from one point to another in a given time period (usually a second). This kind of bandwidth is usually expressed in bits (of data) per second (bps). Occasionally, it's expressed as bytes per second (Bps).

Historically these chip-to-chip interconnections used electrical signaling and were provided at lowest cost by copper lines in printed circuit boards and by electrical card-to-card connectors. A large number of chips on multiple cards would be connected in this fashion.

Attempts made in the art to improve the chip-to-chip interconnections noted above using multiple connections to achieve desired bandwidth and throughput have all had their drawbacks.

As computers get faster, their net lengths limit the speed that signals can be transmitted. In the past, circuit cards have been connected to each other by right angle connectors. This arrangement forces the connectors of one circuit card to have its connectors along a first edge. This limitation forces all signals leaving the card to be carried to another card to connect to the first edge. Signal nets that start on the edge opposite to the connector first edge are forced to travel the full width of the circuit card thus making the net longer than it could be if it left the circuit card in the middle of the card. This longer net length thus limits the frequency at which the signals travel.

United States Patent Publication 20090004892 relates to a board connector module including a frame, accommodating an array of substantially-parallel signal leads (S) and ground leads (G) extending in a longitudinal direction (L). The frame includes edges extending substantially parallel to said leads and one or more transverse bars extending between said edges. The transverse bars of the frame may resist deflection or buckling of these leads and consequently allow for higher stack heights in mezzanine circuit board assemblies U.S. Pat. No. 7,746,654 discloses a computer system is that includes a chassis, a system board coupled to the chassis, and a first connector extending from the system board at a first height and configured to receive a first printed circuit board, wherein the first printed circuit board is configured to be parallel to the system board when received by the first connector, and a second connector extending from the system board at a second height and configured to receive a second printed circuit board, wherein the second printed circuit board is configured to be parallel to the system board when received by the second connector. Other computer systems are provided that include a first mezzanine card and a second mezzanine card or multiple connectors and a plurality of printed circuit boards.

U.S. Pat. No. 7,429,176 discloses a modular board to board mezzanine ball grid array BGA connector including a plug, a receptacle and if needed an adapter. The plug and the receptacle can be made form the same base pieces to accommodate different stack heights. If a greater stack height is needed, spacers can be used in the plug and the receptacle to accommodate a greater selected stack height. The plug and the receptacle both include a base having interstitial diamond recesses in which the solder balls are disposed and in which one end of a contact is inserted. The plug may further include a plug cover that can be connected to the base, and the receptacle may include a receptacle cover that fits over its base.

U.S. Pat. No. 7,425,137 discloses a connector assembly for connecting first and second circuit boards in a substantially parallel relationship. It includes a first connector mateable to the first circuit board and a second connector mateable to the second circuit board. A third connector is mateable to the first and second connectors and is positioned therebetween. The third connector includes a wafer configured to provide a predetermined spacing between the first and second circuit boards.

U.S. Pat. No. 7,420,819 relates to an expanding high speed transport interface hardware method for motherboard. In the method, a mezzanine card is provided and the mezzanine card has a chip socket. An expanding hardware with high speed transport interface is installed in the chip socket of the mezzanine card. In addition, the mezzanine card is inserted into an idle CPU socket in a motherboard with plural CPU structure to make the mezzanine card electrically connect with the second CPU socket, so that the mezzanine card and the expanding hardware become components of the motherboard. Finally, the motherboard is activated to detect the mezzanine card and the expanding hardware and set the CPU bus as a data transmission path between the mezzanine card and the expanding hardware so as to expand interface hardware for the idle CPU socket.

U.S. Pat. No. 7,407,387 defines a modular board-to-board mezzanine ball grid array (BGA) connector which includes a plug, a receptacle and if needed an adapter. The plug and the receptacle can be made form the same base pieces to accommodate different stack heights. If a greater stack height is needed, spacers can be used in the plug and the receptacle to accommodate a greater selected stack height. The plug and the receptacle both include a base having interstitial diamond recesses in which the solder balls are disposed and in which one end of a contact is inserted.

U.S. Pat. No. 7,390,194 discloses reduced insertion force mezzanine connector is used to couple first and second circuit boards. In one embodiment a connector frame has a first end disposed against the first circuit board and defining a first wall, and an opposing second end disposed against the second circuit board and defining a second wall generally parallel with the first wall. A plurality of wafers is disposed. Each wafer has a first edge in sliding contact with the first wall and an opposing second edge in sliding contact with the second wall. A plurality of electrically conducting pathways extends along each wafer from the first edge to the second edge. A wafer guide structure defines a plurality of wafer-support aisles on the first and second walls for receiving the edges of the wafers to constrain the wafers with a fixed spacing and generally parallel alignment.

The patented prior art cited above has become less pertinent because, as computers have become faster, i.e., as communications data rates have increased, transmission line impedance discontinuities and frequency-dependent channel loss have limited the maximal electrical transmission distance. The result is that the net lengths of the computer limit the speed at which signals can be transmitted. These electrical signaling constraints have been mitigated, however, by: improved frequency-dependent and noise canceling signaling technology in the chip driver and receiver circuits; improved impedance matching design in the cards and connectors; and by using lower loss materials in the cards and connectors.

A more serious limit on the use of electrical chip-to-chip signaling has been the lack of a sufficiently reliable, separable and dense electrical card-to-card connection technology. As a result recent large-scale computing systems have trended towards signaling electrically over the largest possible circuit card, and using dense but expensive optical interconnections between circuit cards.

Since optical signaling is expected to remain more expensive than short-distance electrical signaling for quite some years to come, overall system cost would be reduced if dense electrical signaling could be used between circuit cards, thereby reducing the amount of optics in the system.

FIG. 1 depicts an exploded version of the mezzanine connector disclosed in copending parent case, U.S. patent application Ser. No. 12/986,132, to Thomas Cipolla, et al., the contents of which are incorporated by reference herein. The mezzanine connector of FIG. 1 depicts circuit card 1 and circuit card 2, a plurality of daughter circuit cards 2A, connector 3, comprising a header assembly 4, a top-base 6, a bottom-base 7 and a plurality of wafer assemblies 8. Header assembly 4 components comprise a header-base and a plurality of pin assemblies (not shown). Connector 3 is positioned orthogonally to circuit cards 1 and 2.

The present invention is an improvement over the Cipolla parent case noted above because the present invention provides for a tall mezzanine connector which does not utilize a header or other elements found in the prior art reference. The present invention therefore contains fewer separable interfaces and fewer subcomponents. It should therefore provide the desired function at lower cost and with higher reliability.

The present invention relates to a mezzanine connector which allows signals to leave both cards that are connected together from the middle of either card. Mezzanine connectors are known in the art, and have been used for applications similar to the present invention. The limitation of these existing connectors is their height.

The tallest mezzanine connectors presently available are on the order of 50 mm board-to-board (Tyco Micro-Strip connectors). This spatial dimension allows limited access to the space between circuit cards for placing other tall components, for example, daughter circuit cards in the space between the main circuit cards. Examples of daughter circuit cards are the VMEbus card, PCI card or memory card. These cards extend the functionality of the main or "mother card."

The present invention allows limited access to the space between circuit cards for placing other tall components, for example, daughter circuit cards in the space between the main circuit cards. For future generation computers the ability to place daughter cards on circuit cards with the ability to stack another (or several) mother/daughter cards on the first one is highly desirable in order to minimize the length of signal nets thus maximizing the frequency the circuits can run.

The mezzanine connector of the present invention is an improvement in the art by virtue of its high speed, impedance-controlled signaling while retaining low connector cost; it allows large stack heights, so that multiple major system circuit boards can be stacked with a significant amount of tall electronics, power delivery and cooling on each system circuit board; and has a compliance feature which permits said large stack heights between system circuit boards and permits the system circuit boards themselves to be large in area.

BRIEF SUMMARY OF THE INVENTION

The tall flexible mezzanine connector of the present invention is a more detailed description of the description set forth in parent copending U.S. application Ser. No. 12/986,132 filed Jan. 6, 2011.

The present invention is an improved tall mezzanine connector assembly comprising at least one flexible circuit board having a pair of terminal ends, with separable interface connectors on each of the terminal ends, a pair of receptacle assemblies having conducting contact means in contact with said separable-interface connectors on each said terminal end to provide a face-to-face, mechanically compliant, electrically high-speed signal connection between two system circuit boards.

In describing the instant invention, the word "assembly" as used herein refers to a component comprising a number of parts or subassemblies put together to perform a specific function. The connector assembly of the present invention comprises means for connecting at least two electronic circuit boards, at any location along said circuit boards. The electronic circuit boards are positioned parallel to each other. The connector assembly comprises a wafer assembly and a pair of receptacle assemblies. The wafer assembly comprises at least one printed circuit card having two terminal ends, each of which ends are each in contact with and secured to one of the receptacle assemblies. The connector assembly has conducting means to allow current to flow from an exposed end of one receptacle assembly through means imbedded in the wafer assembly through conducting means in the second receptacle assembly to the exposed end of the second receptacle assembly.

The "conducting means" takes the form of conductive signal paths in said printed circuit connector extending from a first edge of the circuit card to a second edge of the circuit card. There is a return current path means in the connector substrate for providing a constant impedance and effective shielding between said signal conductors.

The return current path mentioned above is typically connected to logic ground, but could alternatively be connected to a nonground voltage domain. For the purpose of this filing, when we state "ground," we mean a return current path that can be connected to logic ground but that could carry another voltage domain. The primary return current path mentioned above is usually provided by a solid plane that takes up most or all of a wafer circuit card metal layer. For the purpose of this filing, when we describe an entire metal layer as "ground," we mean that this metal layer is a solid plane that provides a return current path. However, as we will describe, additional return current path conductors and additional signal-to-signal electrical shielding can be provided by narrow etched lines.

The connector assembly also contains means for contacting the conductive signal paths on the flexible printed circuit card onto each of said receptacle assemblies, and means on said receptacle assemblies for contacting the electronic circuit boards.

The wafer assembly comprises at least one solid flexible printed circuit card; however, the wafer assembly is preferably made up of a plurality of thin circuit cards. When assembled in use, the plurality of circuit cards are held in place by a pair of circuit card holders positioned along the vertical side edges of the circuit cards.

The circuit cards comprising the wafer assembly are herein referred to as "wafer circuit cards." The wafer circuit card is formed of metal layers, typically copper, separated by dielectric layers. One embodiment uses build up circuit card technology, as commonly done for the laminate substrates of electronic chip packages. In such case, the wafer circuit card starts with a central structural dielectric core plane, covered on each face with a conductive layer of metal. Additional layers of dielectric and metal could be added on both top and bottom surfaces of the circuit board by an additive process, one layer of dielectric or metal at a time. However, the preferred embodiment of this invention uses lower-cost core and fill card technology, as commonly used on many larger circuit cards today. This core and fill card technology will be explained in detail below, used in accordance with the present invention.

A core in the wafer circuit cards consists of a planar sheet of dielectric with etched copper electrical circuits on both its top and bottom faces. A fill used in accordance with the present invention consists of a single sheet of dielectric with no outer copper plating. The cores and fills are brought together and are placed in an alternating arrangement in various combinations to form the wafer circuit cards used in accordance with the present invention.

Although the detailed description in this filing is limited to only those wafer circuit card constructions which are presently lowest in cost, this invention can be extended to cover a range of additional wafer circuit card constructions. In addition to the build-up card technology mentioned above, one could use cores that are more complicated than the basic core described above. Instead of having just two copper layers per core, a more complex core is comprised of two dielectric and three copper layers as the basic building block of the alternating core - fill card structure. For example the ground-signal-ground-ground-signal-ground construction in FIG. 17 becomes a ground-signal-ground-signal-ground construction, with five copper layers instead of six. FIG. 19 includes one three-layer card construction, where one of two copper layers on the central core has been removed. A variety of additional card stack-ups could be designed which would work well with this invention. However, the detailed description here is limited to those card stack-ups that are the most cost effective.

The combination of layered cores and fills used in the present invention to form a wafer circuit card forming one component of the wafer assembly is as follows: a four-layer signal-ground-ground-signal card, a four-layer ground-signal-ground-signal card, a six-layer ground-signal-ground-ground-signal-ground card, a three-layer signal-ground-signal card and a five-layer ground-signal-ground-signal-ground card.

Each wafer circuit card generally is substantially rectangular in shape having a top, bottom, two sides and a front and a back. The terms "front" and "back" may be used occasionally herein to designate the front face and the back face of the circuit card. It is noted that this usage may be at odds with industry usage which refers to the front face of the card and the back face of the card as the "top" and "bottom" respectively of the circuit card. In the event any of these terms is used herein, it should be understood that the terms mentioned above—front-top and back-bottom—are equivalent.

On the top, the bottom and on each of the copper layers internal to the wafer circuit card, there is a plurality of etched copper electrical circuits. These can either be signal lines or current return paths that extend from the front of the wafer circuit card to the back of the wafer circuit card. The current return paths will often be wide lines or entire planes, and if connected to logic ground may be called ground planes. At each terminal end of the wafer circuit card, (i.e., the front and the back) the signal lines or ground connections are brought to the outer top and bottom surfaces of the wafer circuit card and flare out into signal or ground contact pads which are adapted to contact lower and upper contact elements in the receptacle assembly. The upper and lower ground pads located at the terminal end of the circuit card are positioned parallel with and adjacent to the signal pads. The ground provides a return current path for providing a constant impedance and effective shielding between said signal lines.

The receptacle assembly attached to the wafer assembly has contacting means for contacting said signal pads on the wafer circuit card and forwarding current onto each of the parallel electronic circuit boards to which the mezzanine assembly is connected on to each of said receptacle assemblies.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is an exploded isometric view of the elements comprising the wafer assembly depicted in FIG. 5.

FIG. 6A is a magnified view of the structure within area E in FIG. 6.

DETAILED DESCRIPTION OF THE PREFERRED EMBODIMENT

The preferred embodiment of the present invention will be described below with reference to the accompanying drawings.

Figure 1:
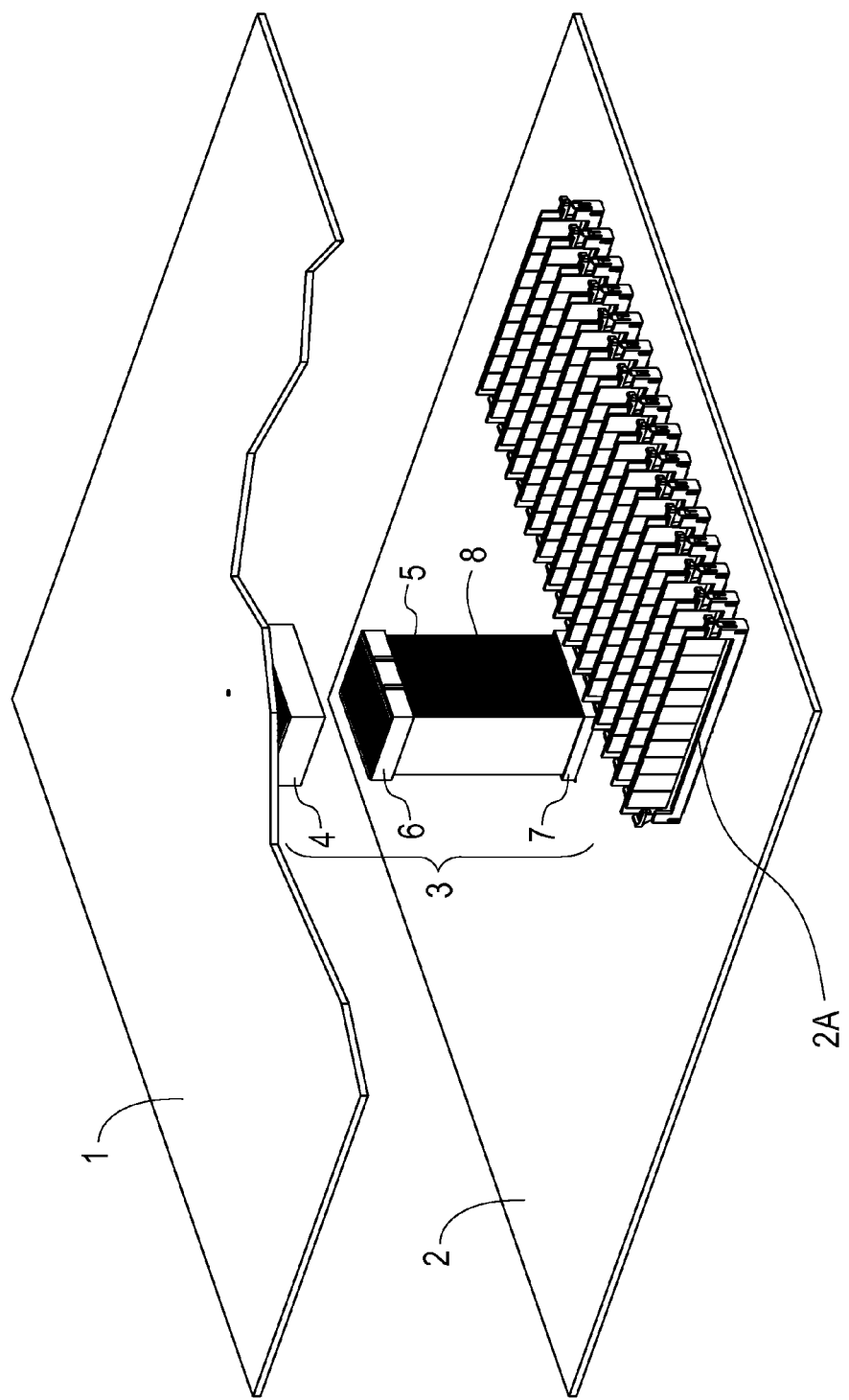
FIG. 1 depicts an exploded version of the mezzanine connector found in the prior art.
Figure 2:
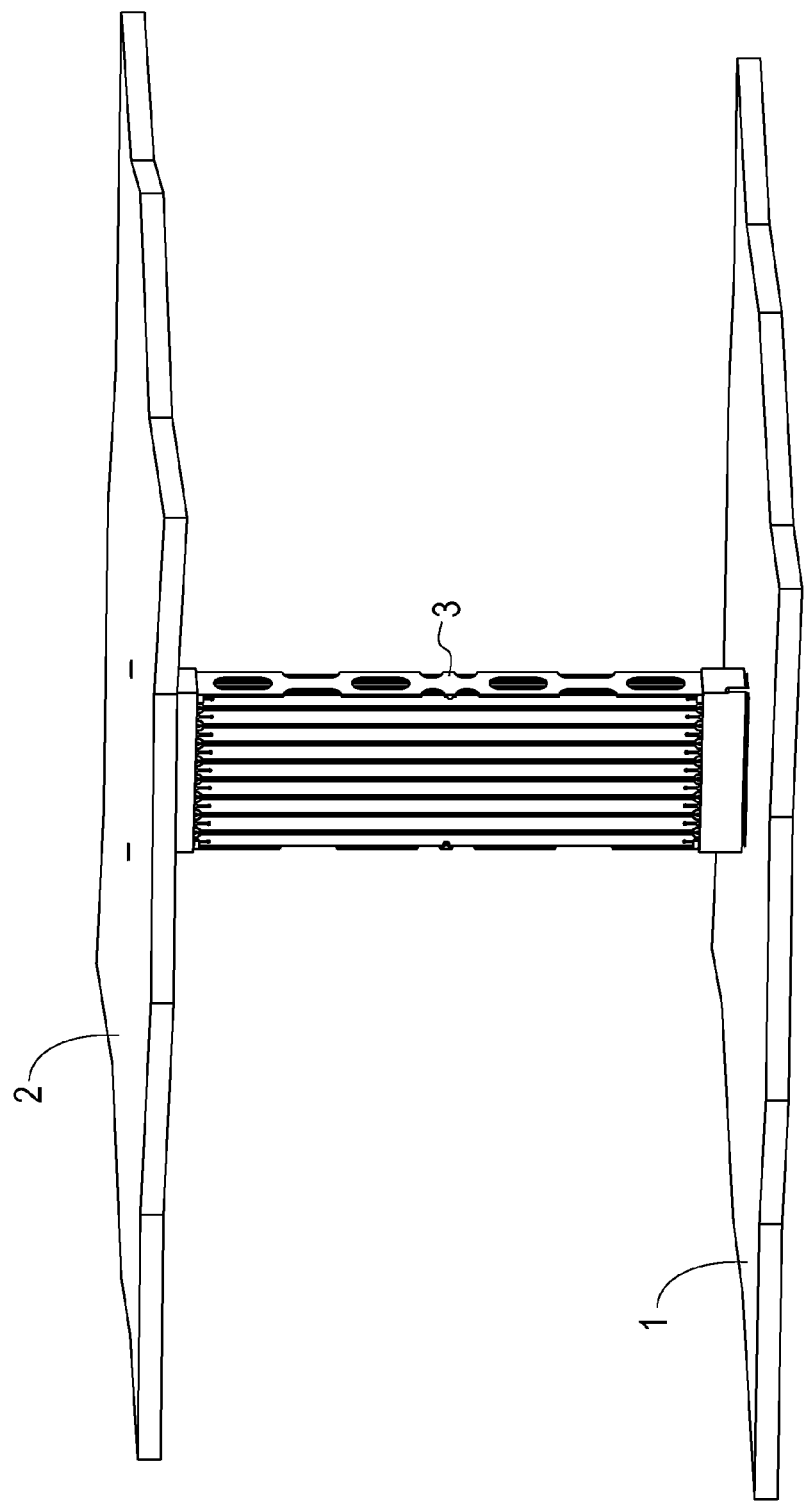
FIG. 2 is a view of the elements comprising the improved mezzanine connector of the present invention.

FIG. 2 illustrates novel tall mezzanine connector 3 connecting circuit board 1 to circuit board 2. Circuit boards 1 and 2 are located parallel to each other and tall mezzanine connector 3 connects them positioned substantially in the center of each and orthogonal to them both.

Figure 3:
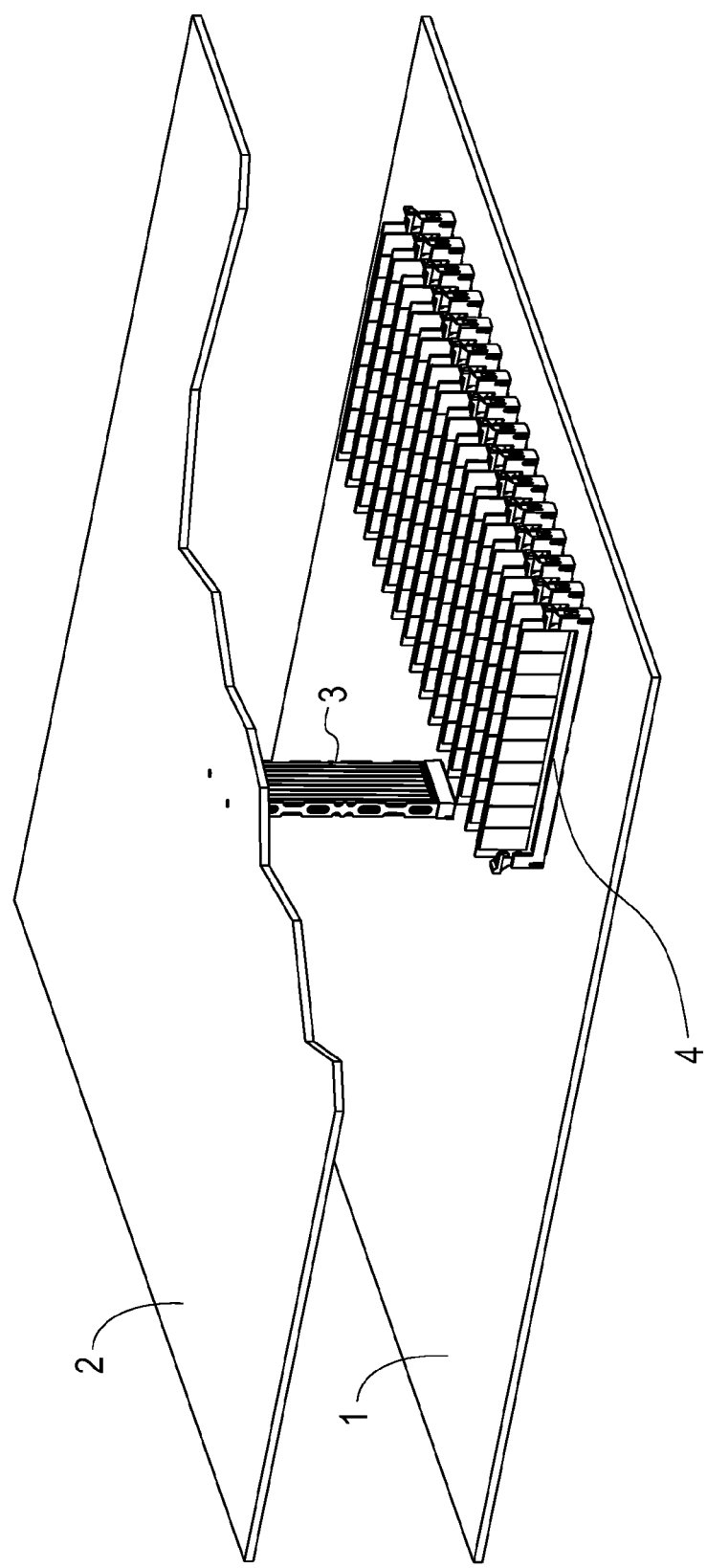
FIG. 3 is the improved mezzanine connector of the present invention with an added feature.

FIG. 3 depicts the assembly illustrated in FIG. 2 adapted to allow circuit board 1 and circuit board 2 to be connected with daughter cards on each or all of them as a result of the contact with tall mezzanine connector 3.

In describing the present invention, the term "connector" as used herein encompasses a connector assembly comprising a bottom receptacle and a top receptacle connected to a wafer assembly.

The expression "wafer assembly" comprises a plurality of wafer circuit cards, and a means to hold them together in a parallel spatial relationship. Further, as used herein, "wafer circuit card pads" refers to contact pads on the wafer printed circuit card, "receptacle contact fingers" refers to fingers that contact the wafer circuit card pads and "metal contact" refers to fingers that attach to either mother board connected to the mezzanine connector.

The terms "signal lines" or "signal pairs" are specific embodiments within the generic scope of the "etched copper electrical circuits" described herein. "Etched copper electrical circuits" includes "signal lines" as well as "return paths," "return planes," "ground lines," or "ground planes." Thus a "signal card" is a wafer circuit card that possesses signal lines that are electrically conductive.

Figure 4:
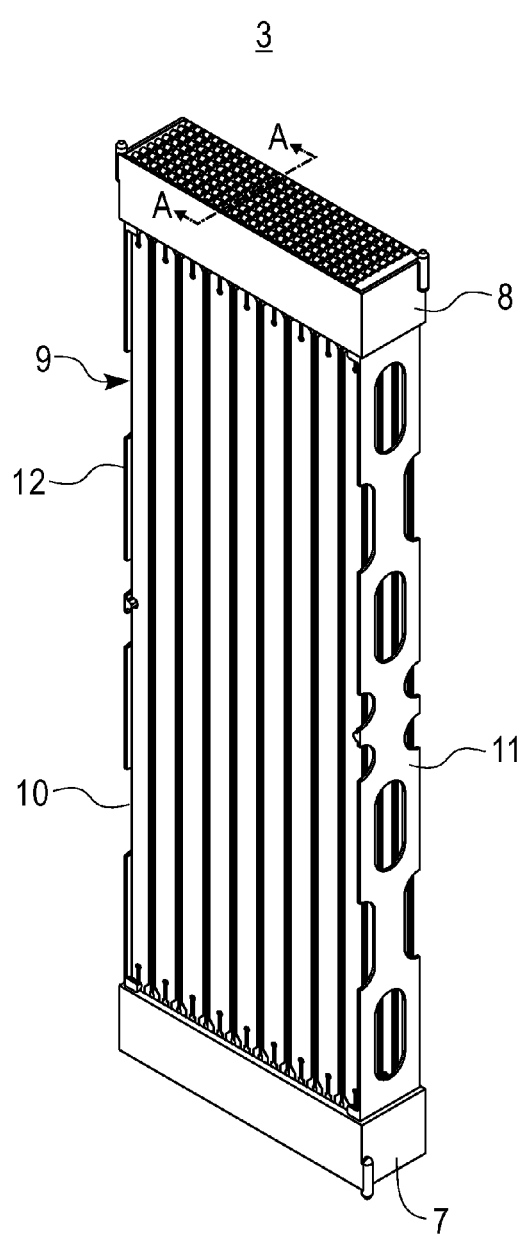
FIG. 4 is an isometric view of the elements comprising the connector assembly.

FIG. 4 illustrates the fully assembled connector assembly 3 (as designated in FIGS. 2 and 3) which comprises a bottom receptacle 7 and a top receptacle 8. Receptacles 7 and 8 are connected to wafer assembly 9 which is comprised of a plurality of circuit cards 10 (not all fully shown) held in place by circuit card holders 11 and 12.

Figure 5:
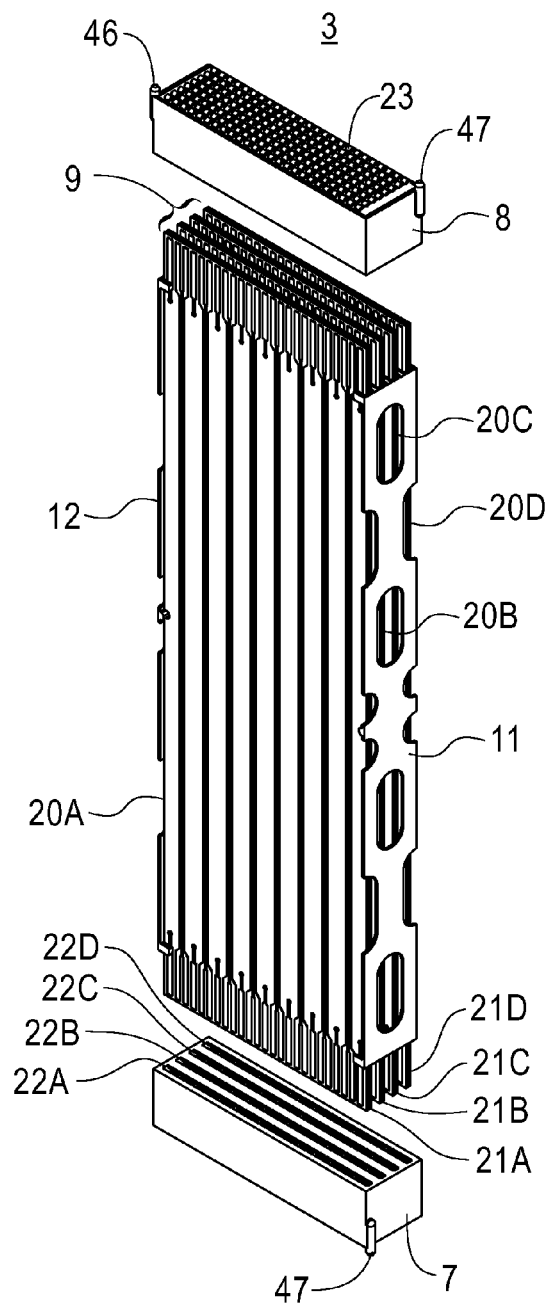
FIG. 5 is an exploded isometric view of the elements comprising the connector assembly depicted in FIG. 4.

FIG. 5 depicts an exploded version of the connector showing the relationship with respect to one another among three component parts of connector assembly 3 depicted in FIG. 4. The exploded version of connector assembly 3 shows bottom receptacle 7, top receptacle 8 and wafer assembly 9. Wafer assembly 9 is placed between, inserted in and in contact with receptacle 7 and receptacle 8. Wafer assembly comprises circuit cards 20A, 20B (not fully shown), 20C (not fully shown) and 20D (not fully shown) and circuit card holders 11 and 12. Each of the terminal ends of wafers 20A, 20B, 20C and 20D has wafer circuit card pads 21A, 21B, 21C, 21D along the width of said wafer circuit cards.

Receptacles 7 and 8 are adapted to receive wafer circuit card pads 21A, 21B, 21C, 21D etc. as illustrated by slots 22A, 22B, 22C, 22D extending along the horizontal width of receptacle 7 (slots of receptacle 8 not shown) contacting the wafer circuit cards. The exposed surface of receptacle 8 has a plurality of rows and columns of receptacle contact fingers 23 (depicted in FIG. 8) that are placed in contact with matching wafer circuit pads on the wafer circuit card when the two are joined in place. Receptacle 8 has the identical slot arrangements (not shown) on its non-exposed bottom as depicted in receptacle 7. Receptacles 7 and 8 are attached to the parallel circuit boards depicted by any convenient means, such as soldering, etc. As noted above, circuit card holders 11 and 12 secure wafer assembly 9 comprising the plurality of wafer circuit cards in place. Alignment pins 46 and 47 serve to position and secure the improved tall mezzanine connector unit of the present invention in its proper location on a circuit card.

FIG. 6 depicts an exploded version of the wafer assembly 15 of the embodiment of the present invention depicted in FIG. 5. Wafer assembly 15 comprises wafer circuit cards 20A, 20B, 20C and 20D and circuit card holders 11 and 12. Wafer circuit cards 20A, 20B, 20C and 20D have a plurality of elements which are duplicated along the front and rear of each said wafer circuit card.

FIG. 6A is a magnified view of the structure within area E in FIG. 6. FIG. 6A shows parallel circuit lines 30 and 31 flaring out to form wafer circuit contact pads 32 and 33 respectively. FIG. 6A also depicts via 34 connected to ground pad 35. The set of elements embodied in elements 30 to 35 are repeated along the width of the tops and the bottoms of the wafer circuit cards comprising wafer assembly 9.

Figure 7A:
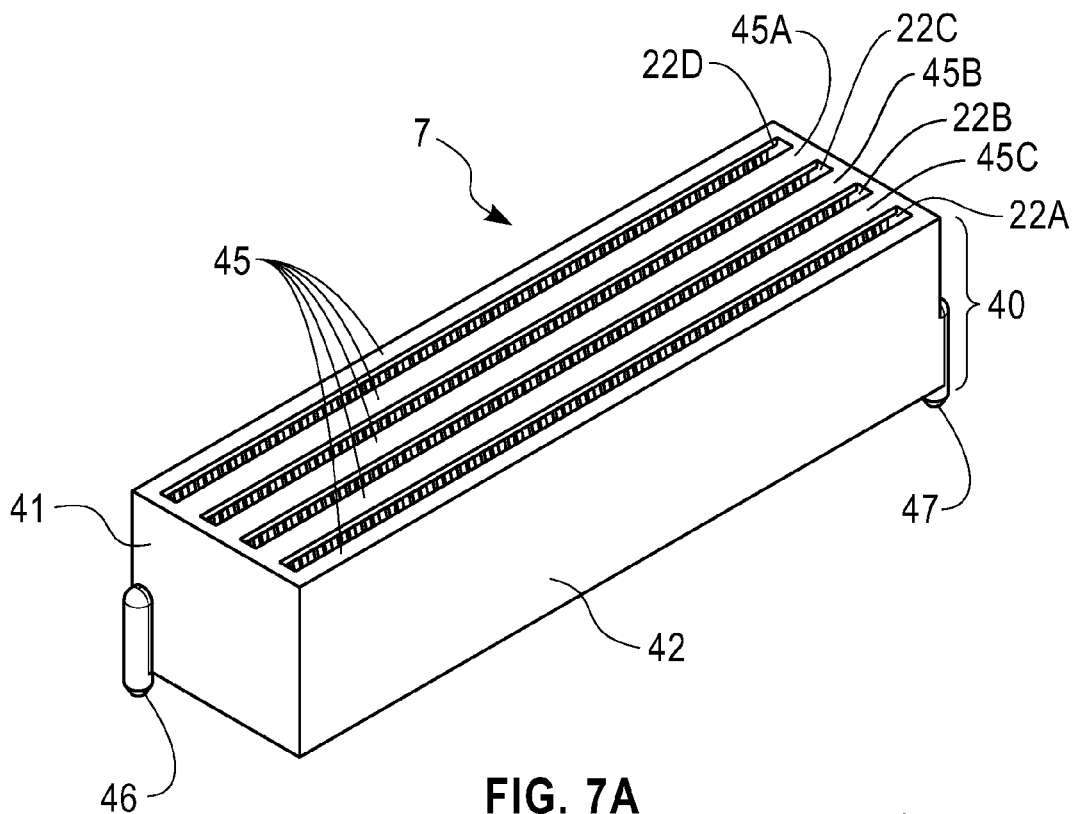
FIG. 7A is an isometric view of the unexposed face of a receptacle assembly used in accordance with the present invention.

FIG. 7A is an isometric view of the unexposed side of receptacle 7 (or 8). The term "unexposed" as used herein signifies that area of the receptacle that receives, in the slot provided, the terminal ends of the wafer circuit contact pads and ground lines when in use. The receptacle is a housing 40 comprising a container constructed with four sides 41, 42, 43 (not shown) and 44 (not shown) perpendicular to upper slotted surface 45. FIG. 7A shows alignment pins 46 and 47 diametrically opposite each other attached at the vertex of where sides 41 and 44 (not shown) intersect and where sides 42 and 43 (not shown) intersect. Alignment pins 46 and 47 serve to position and secure the tall mezzanine connector unit of the present invention in a predetermined location on a circuit card. Housing 40 in FIG. 7A possesses ribs (comprising elements 45 and top edge surface of 42), specifically, 45A, 45B and 45C which, with upper edges of sides 42 and 44 (not shown) form slots 22A, 22B, 22C and 22D. When fully assembled, the terminal ends of the wafer circuit cards with their vertical contact pads are inserted into and received by slots 22A, 22B, 22C and 22D as depicted in FIG. 4.

Figure 7B:
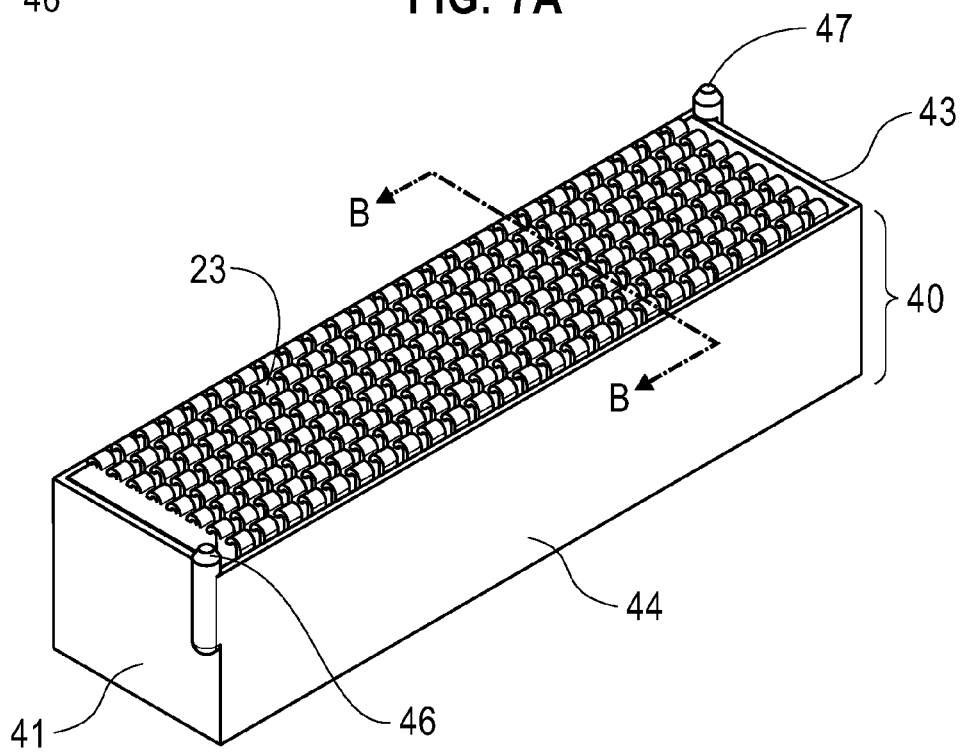
FIG. 7B is an isometric view of the exposed face of a receptacle assembly used in accordance with the present invention.

FIG. 7B is an isometric view of the exposed side of receptacle 7 (or 8). The term "exposed" as used herein signifies that surface of the horizontal plane of the receptacle that contacts a circuit board contacts when in use. The receptacle, as noted above is a housing 40 comprising a container constructed with four continuous interconnected sides 41, 42, 43 (both not shown) and 44 enclosing rows and columns of receptacle metal contacts. FIG. 7B depicts a plurality of rows and columns of receptacle metal contacts 23 that are placed in contact with matching wafer contact pads on the circuit card (i.e., 31 and 31A as depicted in FIG. 6) when the two are joined. FIG. 7B also shows alignment pins 46 and 47 diametrically opposite each other attached at the vertex of where sides 41 and 44 intersect and where sides 42 and 43 (both not shown) intersect.

Figure 8:
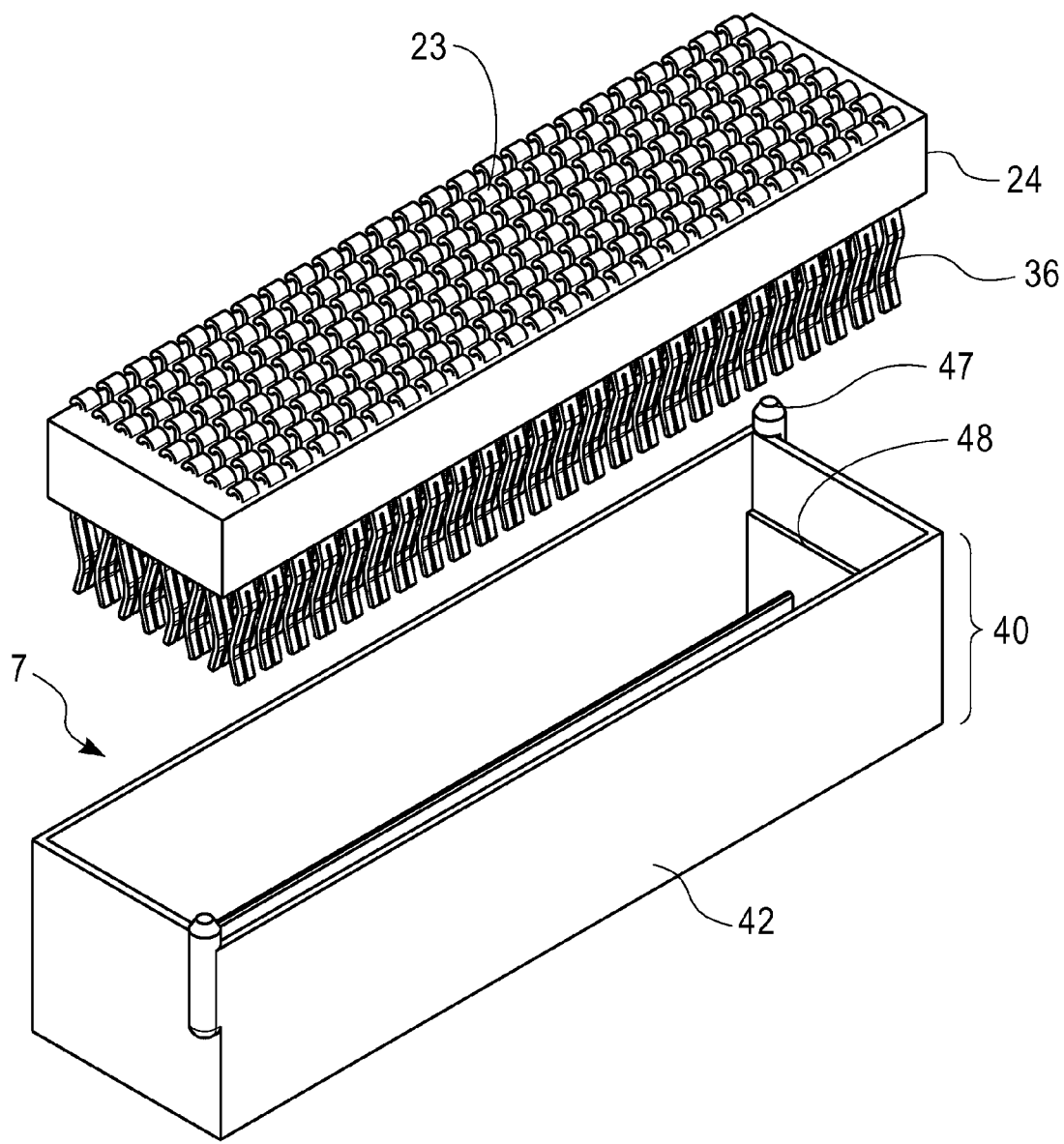
FIG. 8 is an exploded view of the elements comprising the receptacle assembly used in accordance with the present invention.

FIG. 8 is an exploded isometric view of the receptacle depicted in FIG. 7B. Receptacle assembly 7 (or 8) houses a plurality of columns and rows of contacts 23 molded into a plastic frame 24 which is fitted into a housing 40 comprising the side elements described with respect to FIGS. 7A and 7B. Receptacle contact fingers 36 are shaped to act as edge connectors of the wafer assemblies. Receptacle contact fingers 36 are at the opposite end of and an integral part of metal contacts 23.

Element 48 (which is duplicated within the interior of housing 40) provides a ledge that insures that when plastic frame 24 is inserted into housing 40, metal contacts 23 are slightly above the edges of housing 40 so as to make contact with the contacts on connecting circuit card,(i.e., circuit boards 1 and or 2 depicted in FIG. 2).

Figure 9:
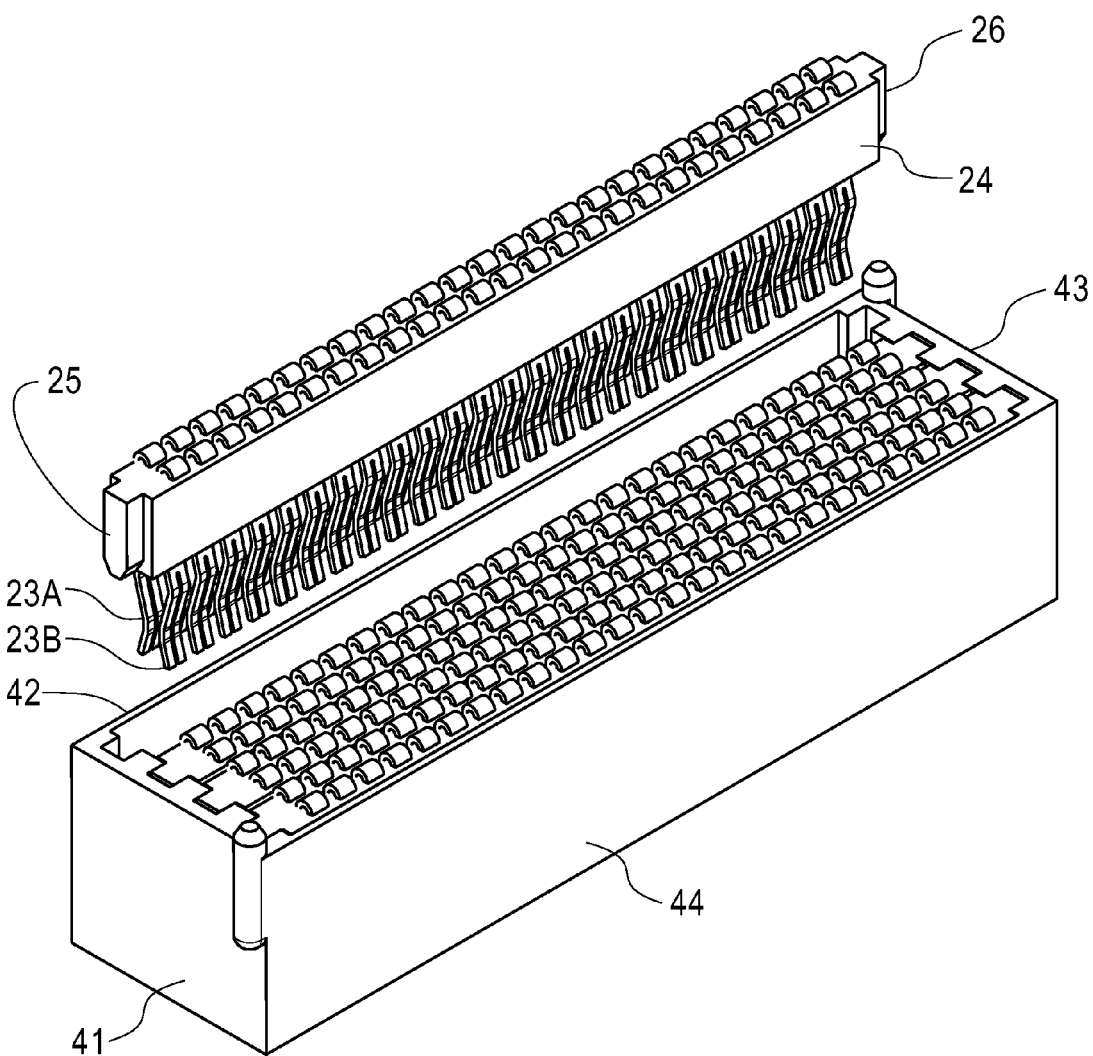
FIG. 9 is an exploded alternate view of elements comprising the receptacle assembly used in accordance with the present invention.

FIG. 9 is an alternate embodiment of the receptacle depicted in FIG. 8. In this embodiment, receptacle contact fingers can be molded into a plastic support strip forming a single row or several rows which are then inserted into receptacle housing 40 comprising the elements described above. In the embodiment shown, two rows of receptacle contact fingers 23A and 23B are molded into plastic support strip 24 in which each row of receptacle contact fingers, (such as 29A and 29B depicted in FIG. 10) contacts one side of a circuit card 20A. The terminal ends 25 and 26 of plastic support strip 24 are formed into a tongue and the interior sides 41 and 43 are grooved diametrically opposite each other so that the two rows of contacts are held in place via tongue and groove means. Obviously other means of securing the contacts within the housing are available.

Figure 10:
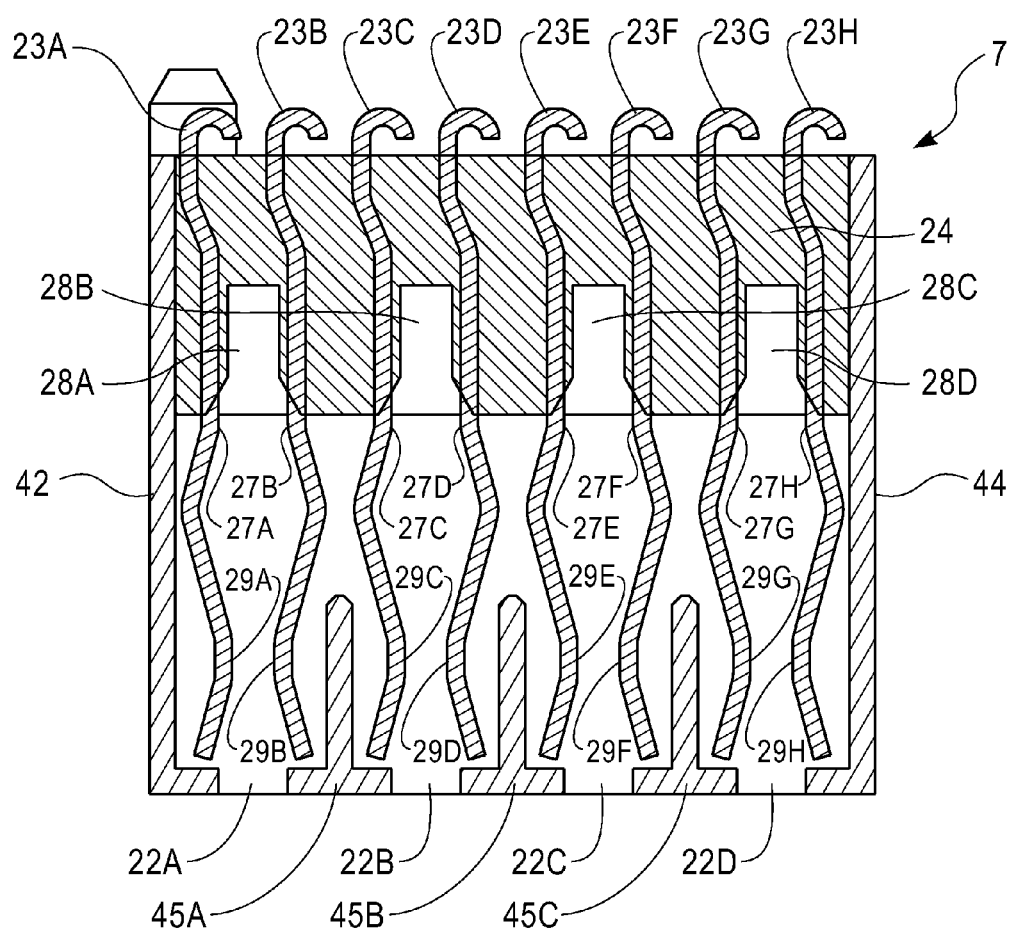
FIG. 10 is a cross sectional view of the receptacle view along the line B-B of FIG. 7B.

FIG. 10 is a cross sectional view of the receptacle along the lines B-B of FIG. 7B. The improved tall mezzanine connector of the present invention provides a continuous conducting connection coupling it at each end thereof with one of the two orthogonally positioned circuit cards. Contact points on each of said circuit cards are connected to conducting lines embedded in the wafer and terminating at wafer pads by means of a plurality of electrically conducting continuous elements. The aforementioned continuous elements have a series of non-continuous segments and terminate at receptacle contact fingers contained within the interior of the receptacle housing.

The connecting element in FIG. 10 is comprised of metal contacts 23A-23B, et al. at the top of the embodiment as depicted, each of which in FIG. 10 has a crook neck configuration extending through plastic support frame 24 into the interior of receptacle housing 40 and terminating at the "bottom" with receptacle contact fingers 29A and 29B. Mid-element sections 27A and 27B extend between metal contacts 23A-23B, et al. and receptacle contact fingers 29A-29B, et al. Mid-element sections 27A and 27B are continuous but are both curved and straight in extending from the top to the bottom.

More particularly, FIG. 10 depicts metal contacts 23A 23B, 23C, 23D, 23E, 23F, 23G and 23H embedded in plastic support frame strip overmold 24 all within sides 42 and 44 of receptacle housing 40.

Within the plastic support frame 24 there is a series of vertical openings, 28A, 28B, 28C and 28D, each of which is positioned between two mid-element sections 27A and 27B. These vertical openings flare out to the space within the open interior of receptacle housing 40. Each mid-element section, i.e., 27A 27B, 27C, 27D, 27E, 27F, 27G and 2H within the open interior of receptacle housing 40 is configured to have a spatial arrangement that corresponds to that of the other mid-element section of the pair, except that the right-to-left sense on one mid-element section corresponds to the left-to-right sense on the other; each element in the pair is a mirror image of the other. Slots 22A, 22B, 22C and 22D are formed between housing walls 42 and 44 and ribs 45A, 45B and 45C.

By way of illustration, when the tall mezzanine connector of the present invention is connected to circuit boards in use, the terminal ends of the wafers having wafer circuit card pads are secured in place in, for example vertical opening 28A. A pair of receptacle contact fingers, e.g., 23A and 23B at 29A and 29B are configured to bow inward adjacent each other so that the receptacle contact fingers of the pair each contact a contact pad on each face of the wafer circuit card.

Figures 11A, 11B:
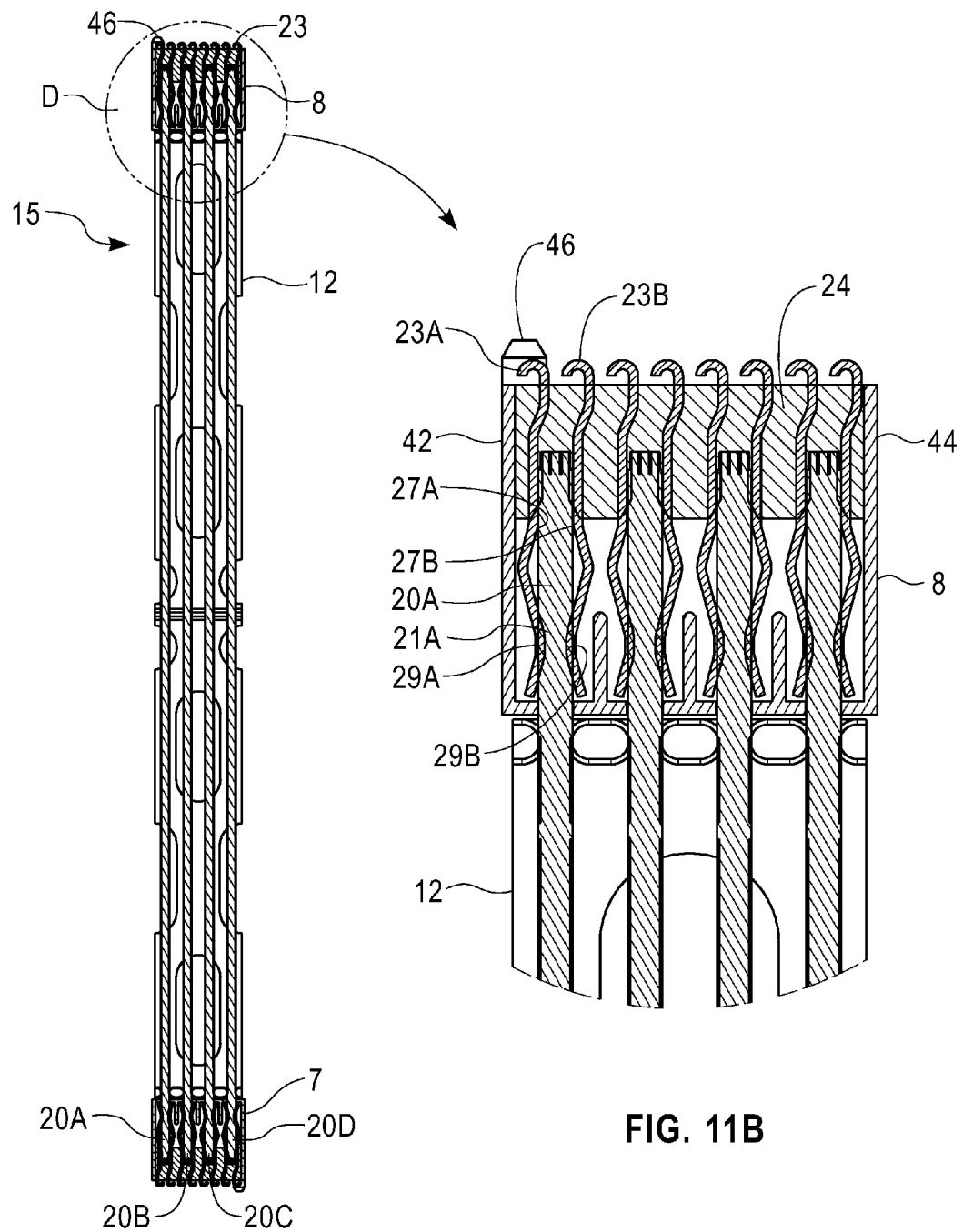
FIG. 11A is a cross sectional view of the connector assembly along the line A-A of FIG. 4.
FIG. 11B is a close-up cross section of the receptacle element contained within area D of FIG. 11A.

FIG. 11A is a cross sectional view of the connected assembly depicted in FIG. 4 along the line A-A. FIG. 11A illustrates the receptacles 7, 8, wafer assembly 15 with wafer circuit cards 20A, 20B, 20C and 20D and circuit card holder 12.

There is generally a large gap between the circuit cards 20A, 20B, 20C and 20D when secured by circuit card holder 12. By "large" is meant relative to the distance between signal pairs on the wafer circuit cards of the wafer assembly. These large gaps prevent coupling between signal lines on different cards when no ground plane exists on exterior layers. For critical applications where more decoupling is needed, circuit cards with ground planes on outer layers and/or ground lines between signal pairs can be used as will be explained in more detail below.

FIG. 11B is close-up cross sectional view of receptacle 8 as depicted in FIG. 11A in area D. For the sake of brevity, the description of this FIG. 11B shall be restricted to an exemplification of a single wafer circuit card within a pair of contacts in a receptacle. The description herein with respect to FIG. 11B while limited to wafer circuit card 20A and elements functioning therewith, applies equally to the other three wafer circuit cards present in the assembly. Aside from the presence of wafer circuit cards in FIG. 11B, the elements depicted in FIG. 11B are identical to those depicted in FIG. 10, and the elements described in conjunction with FIG. 10 are incorporated by reference herein with respect to FIG. 11B.

FIG. 11B shows a circuit card 20A within receptacle 8 fitted into the vertical opening 28A depicted in FIG. 10. Sides 42 and 44 of receptacle 8 enclose plastic support frame overmold 24. Alignment pin 46 and metal contacts 23A and 23B extend above the exposed surface of receptacle 8. Wafer circuit card contact fingers 21A at the terminal end of circuit card 20A are in snug contact with mid-element sections 27A and 27B in vertical opening 28A depicted in FIG. 10 and receptacle contact fingers 29A and 29B. As a result of this continuous connection, current flows from a first circuit board through the tall mezzanine connector to a second circuit board, said circuit boards being positioned orthogonal to the tall mezzanine connector.

Wafer circuit cards, such as those embodied in the present invention are comprised of a layered arrangement of subassemblies. A first subassembly, known in the art as a "core," used in accordance with the present invention consists of a dielectric with etched copper electrical circuits on each side. Such a core has return planes on both sides, signal lines on both sides, signal lines on one side and a return plane on the other side, or a mixture of signal and return on both sides. In less common cases, a composite core with three metal layers can be made from two standard cores; or the metal can be removed from one or both faces or a core to make a core with fewer than two metal layers. Although cores can be manufactured on the outer layers of a circuit card, typical card assembly is done with fills on the outer surfaces of the card, with the outer layers of metal on the top and bottom card surfaces being provided by the same plating process that plates the card vias. In one embodiment of a wafer circuit card, there is a single core, but in general, there are or can be 10 or more such core subassemblies and thus over 20 layers of copper circuits in a circuit card. Cores are usually separated by a second type of layer that consists only of a single dielectric with no copper. This second type of layer is known as a fill. In one embodiment, fills are placed above and below the single core, giving a fill-core-fill construction to the card. The final plating process adds an outer layer metal, giving a plating-fill-core-fill-plating construction with four metal layers total.

In circuit cards with fills on the outside and cores having two copper layers, there can be as many as N+1 of these fills, where N equals the number of cores. The fill layer consists only of a partially cured dielectric. When all the cores and fills are brought together, the entire wafer card assembly is then fully cured in an oven and the partially cured fill material spreads in between the copper etches of the cores and also adheres to the cores, to bond all the subassemblies together. After this step, holes are drilled for vias (and any other type of holes) and then the via holes are plated to complete the vias and thus providing electrical connections from one metal layer to the other The specific elements of wafer circuit card 20A are identified herein with the express understanding that these elements are duplicated on the rest of circuit card 20A as well as on wafer circuit cards 20B, 20C and 20D. The elements can also be different on one or more wafer circuit cards, for example, for some wafer circuit cards designed to carry signals and some wafer circuit cards designed to carry power and ground. By way of illustration, wafer circuit card 20A possesses a pair of electrical conducting lines 30, 31, which extend between and in contact with wafer contact pads 32, 32A and 33, 33A at each terminal end of electrical conduction line pairs 30, 31. There are vias 34 and 34A each oriented toward the center of the circuit card, to connect ground pads 35 and 35A to ground planes on the interior of the card.

As seen previously in FIG. 6, there are seven other electrical conducting line pairs (not numbered), each in contact with wafer contact pads arranged parallel to one another along the exposed face (top or bottom fill) of wafer circuit card. There are also eight other ground vias and pads (not numbered) on each end (front or back) of the wafer circuit card.

Thus in the embodiment depicted in FIG. 6, there are a total of eight electrical conducting line pairs equivalent to elements 30, 31 eight wafer card pad pairs equivalent to elements 32, 32A and 33, 33A and nine vias on each end of the wafer circuit card equivalent to element 34 and 34A. These elements are repeated to the same extent in circuit cards 20B, 20C and 20D.

Figure 12:
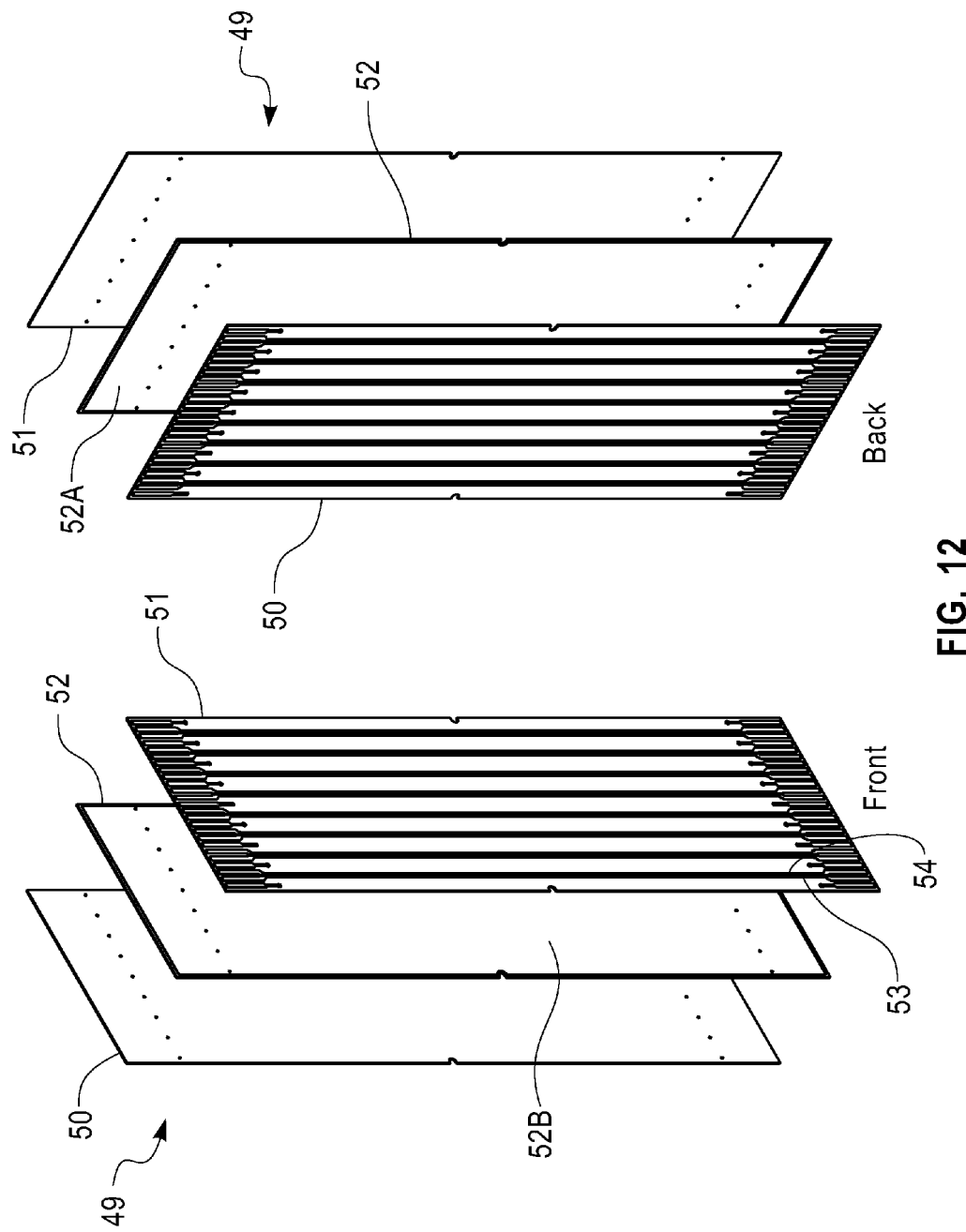
FIG. 12 is an isometric view of the front and back of a wafer circuit card embodiment used in accordance with the present invention designated as a "signal-ground-ground-signal card."

FIG. 12 is an isometric view of the front and back of a wafer circuit card embodiment used in accordance with the present invention designated as a "signal-ground-ground-signal card." FIG. 12 illustrates circuit card 49 which is the "signal-ground-ground-signal card" showing top and bottom faces of each of the cores and fills of the circuit cards. The construction of this card comprises two fills 50 and 51 with copper etch on their external surface and one core 52 which has copper etch on both sides. In this embodiment ground planes 52A and 52B make up both sides of the core The two fills 52A and 52B each have plurality of eight signal pairs of lines on the exterior side as illustrated by lines 53 and 54. The remaining pairs of lines on the surface of the card are identical and parallel to line pairs 53 and 54. Core 52 separates fills 50 and 51. The two fills with all of the circuits are positioned back-to-back and are separated from each other by core 52.

Figure 13:
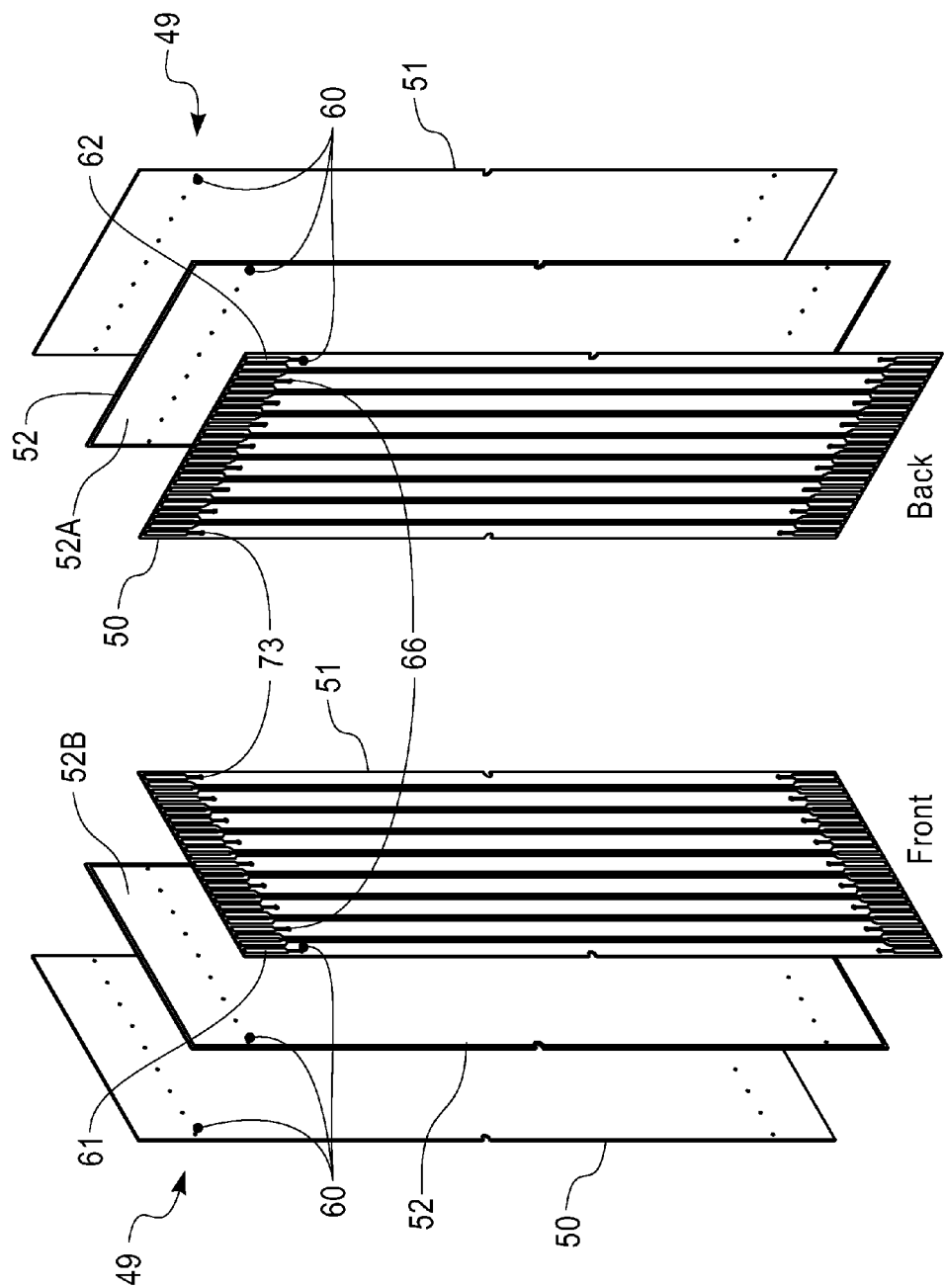
FIG. 13 is an isometric view of the front and back of the wafer circuit card embodiment depicted in FIG. 12 illustrating specific elements found thereon.

FIG. 13 is a duplicate depiction of embodiment 49 illustrated in FIG. 12. Via 60 (extending through three layers 50, 51 and 52) connects ground pad 61 on top side 50 of the assembly with ground pad 62 on the bottom side 52 of the assembly. Via 60 is also electrically connected to ground planes 52A and 52B. Likewise vias 66 through 73 (counting from left to right) connect each ground pad on the top and bottom surfaces of the card and are also electrically connected to internal ground planes 52A and 52B. This is also true for the ground pads and vias present at the front and back ends of card 49. Therefore all ground pads (e.g., every third pad in this embodiment) are electrically connected to each other by way of the vias and ground planes. Since ground planes 52A and 52B lie between the signal pairs on the front of the card and the signal pairs on the back of the card, a signal pair on the front of the card is electrically isolated from a signal pair on the back of the card so there is no cross talk between them. Adjacent signal pairs on the same face of the card are spaced apart from each other by a relatively large distance so little cross talk would take place between adjacent signal pairs. "Little" cross talk can also be made to be "no" cross talk using the "ground lines on signal layers enhancement" explained further below.

Figure 14:
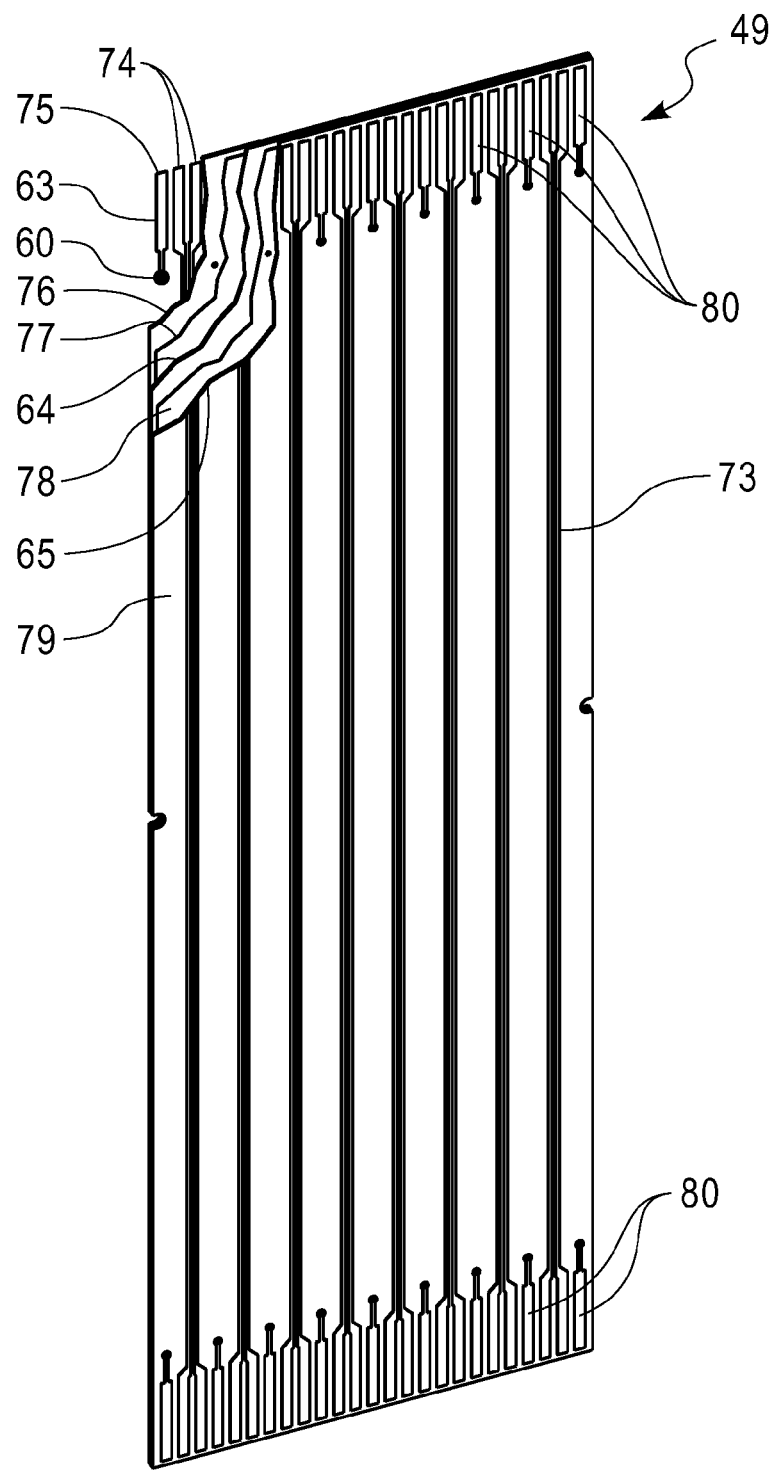
FIG. 14 is an isometric cutaway view of the embodiment depicted in FIG. 12.

FIG. 14 is an isometric cutaway view of the signal-ground-ground-signal embodiment depicted in FIG. 12. FIG. 14 illustrates the assemblies which form the card. Card 49 illustrates a pair of signal pads 74, a ground pad 75 and via 60 and several repeats of these etched onto fill 76, ground layers 77 and 78 etched on core 64 and etch layer 79 etched onto fill 65. In this embodiment, eighteen front ground pads, five of which are illustrated at 80, are connected to ground layers and 77 and 78 by way of vias extending through the wafer circuit card and are also connected to the eighteen rear ground pads, one of which is illustrated at 63. This embodiment shows signal differential pairs, i.e. two signal lines very close to each other carrying the same signal but with opposite voltage polarity. When stray electrical fields interfere with these pairs their close proximity to each other allows the stray electrical field to have an identical or nearly identical effect on each of them. Since they are of opposite polarity this degrading effect is canceled out. The differential pairs shown in this embodiment is an exemplar. Any circuitry can be used such as single ended signals, power lines, ground lines, etc.

Figure 15:
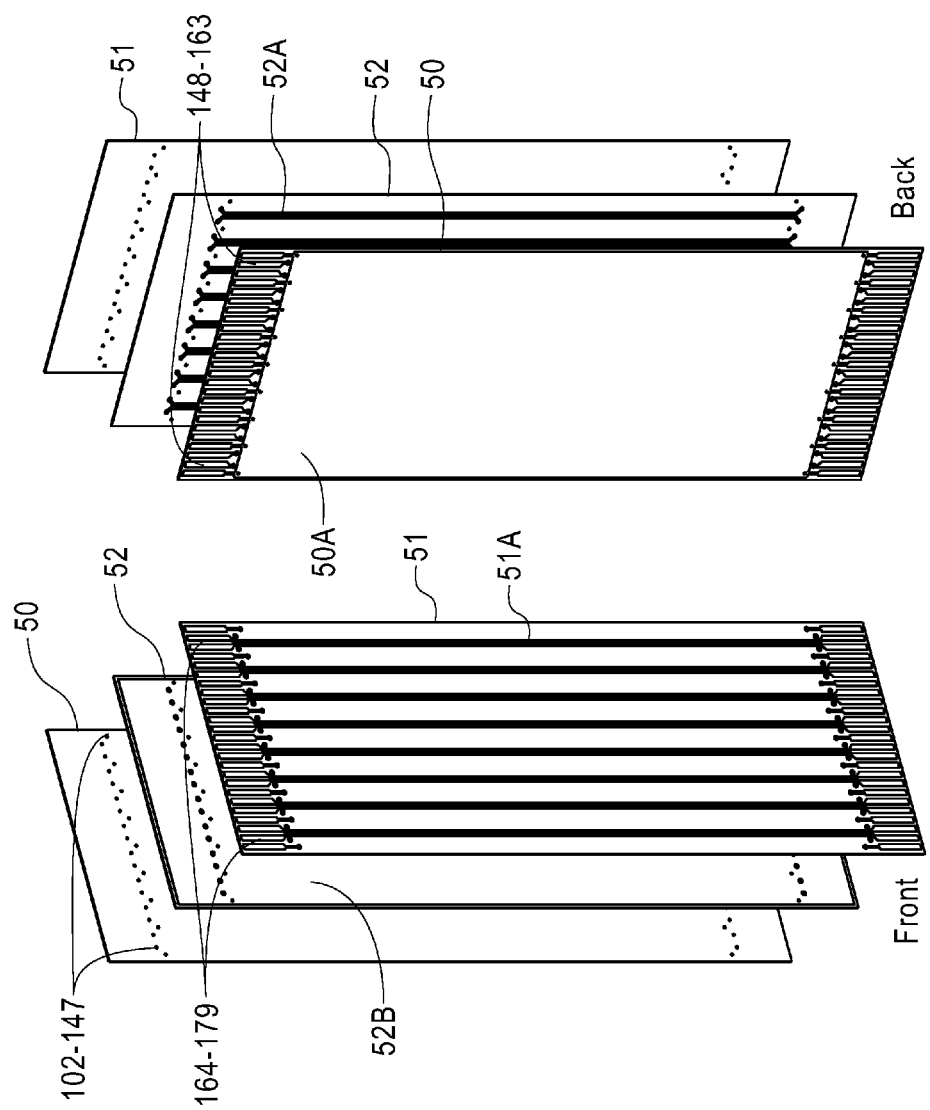
FIG. 15 is an isometric view of the front and back of a wafer circuit card embodiment used in accordance with the present invention designated as a "ground-signal-ground-signal card."

FIG. 15 is an isometric view of another embodiment of a wafer assembly used in accordance with the present invention designated as a "ground-signal-ground-signal" card. This embodiment functions in the same manner as the embodiment depicted and described in FIGS. 12, 13 and 14, except the layers are in a different order. This assembly comprises fills 50 and 51 and core 52. Fill 50 has a ground layer copper etch 50A on its exposed surface. Core 52 has copper etch signal lines 52A on one side and ground layer copper etch 52B on the other side. Fill 51 has copper etch signal lines 51A on its exposed surface. In this embodiment, the shielding is somewhat improved because the ground plane 52B between the signal pairs 51A on the front of the card and signal pairs 52A on core 52 isolates these signal pairs, but the second ground plane 50A on the exterior (back layer) shields signals pairs on this card from signal pairs on an adjacent card.

Figure 16:
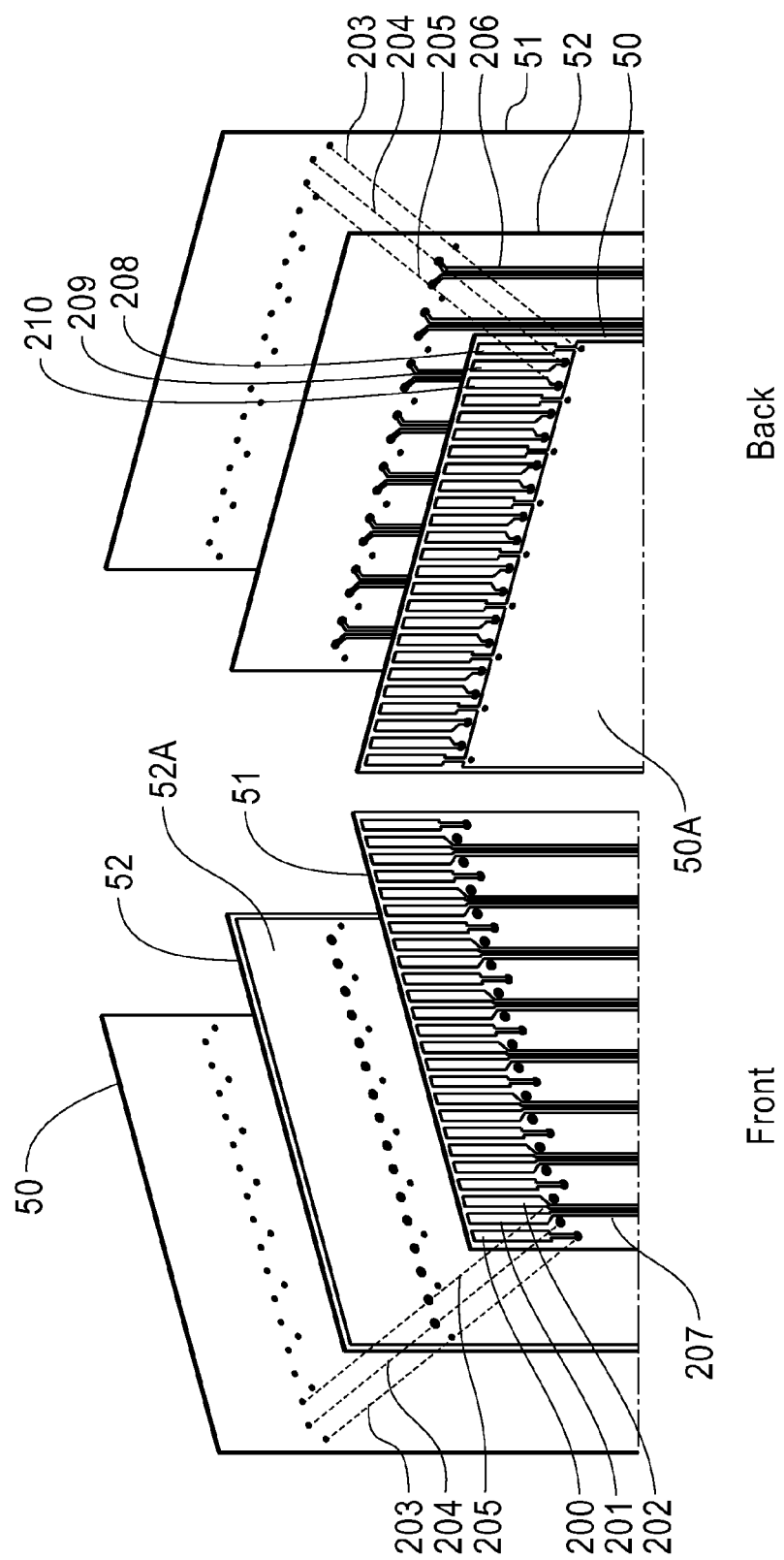
FIG. 16 is a close-up figure of the terminal end area of the front and back of the embodiment depicted in FIG. 15.

FIG. 16 is a close-up figure of the embodiment described with respect to FIG. 15 which shows wafer circuit card pads 200, 201 and 202, vias, three of which are indicated by lines 203, 204 and 205, and signal pairs 206 and 207. With respect to this embodiment, because signal pair 206 is on an interior layer it must be connected to exterior wafer circuit card pads 209 and 210 by way of vias. Vias 204 and 205 connect the signal pair 206 on the interior layer to wafer circuit card pads 209 and 210 on the exterior layer but they do not connect to signal pads 201 and 202 which are signal pads for signal pair 207 on an exterior layer. The rest of the signal pairs on the interior layer are connected to the appropriate wafer circuit card pads in the same manner. Likewise, as on the other embodiments, ground planes 50A and 52A are connected to each other and to wafer circuit card pads 200 and 208 by way of via 203. The ground planes 50A and 52A are connected to other wafer circuit card ground pads by way of vias in the same manner. It is understood that while this example shows eight signal pairs, other circuits are possible with different numbers of signal pairs or single ended signal lines. Either of the embodiments described above may be used depending on the signal speed and other characteristics of the particular circuit being transported by the connector.

Figure 17:
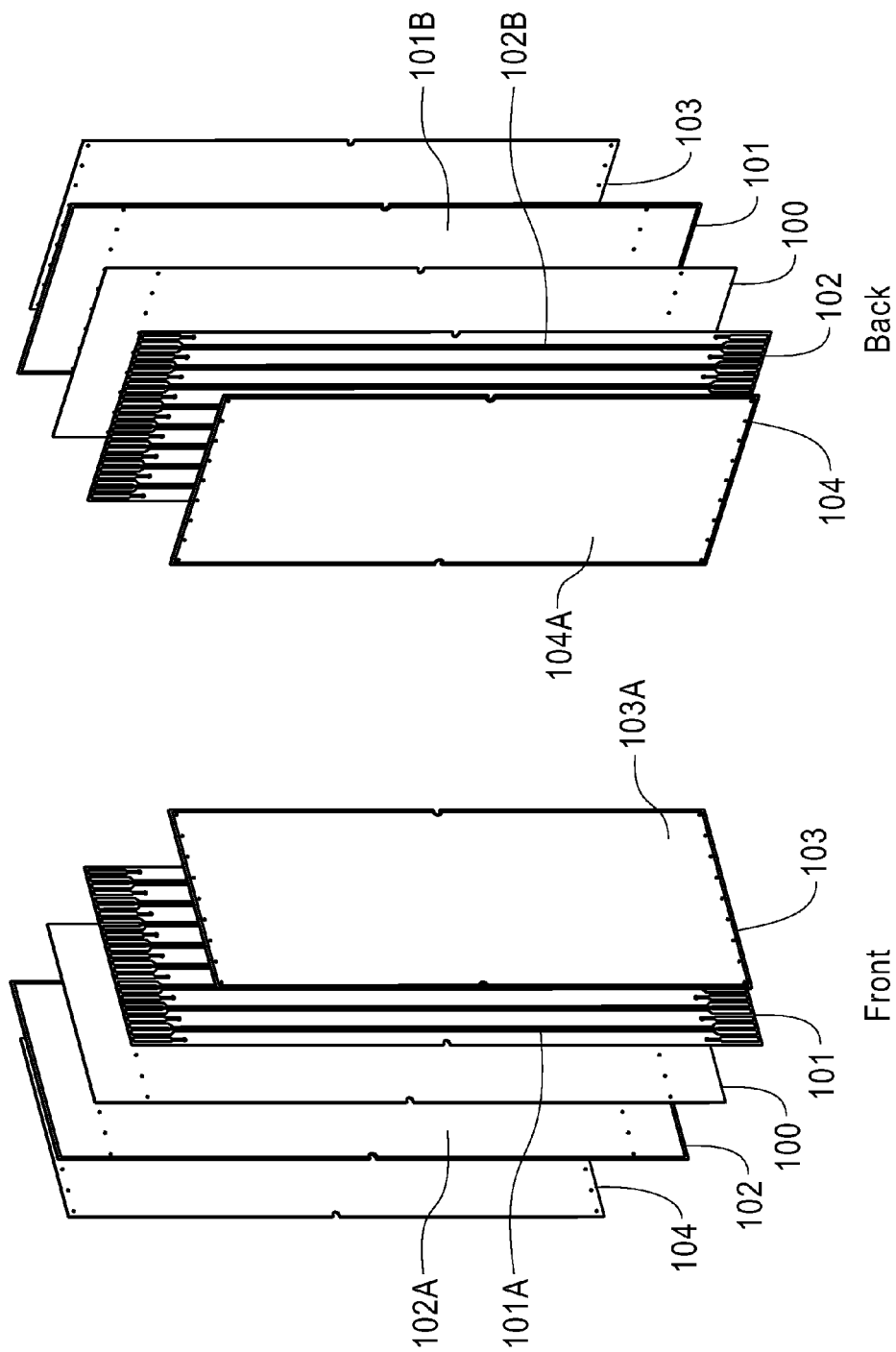
FIG. 17 is an isometric view of the front and back of a wafer circuit card embodiment used in accordance with the present invention designated as a "ground-signal-ground-ground-signal ground" card.

FIG. 17 depicts an embodiment in which ground planes are on the external surfaces of the card as well as ground planes on interior layers between signal layers. Exterior fill 103 has ground plane 103A etched on its external surface. Core 101 has copper etch signal lines 101A on one side and a ground plane 101B on the other. Fill 100 separates cores 101 and 102. Core 102 has ground plane 102A on one side and copper etch signal lines 102B on the other. Finally, fill 104 has a ground plane 104B etched on its external surface. Ground planes 101B and 102A lie between signal layers 101A and 102B isolating these signal layers from any cross talk between them while ground planes 103A and 104B are on external layers which isolate signal layers 101A and 102B from any cross talk external to the wafer circuit card.

FIG. 17 illustrates a ground plane on element 103, a signal layer on one side of element 101 and a ground plane on the other, then, in sequence, a ground plane on one side of element 102 and a signal layer on the other, then in sequence, a ground plane on element 104 making the entire card have a cross section or metal layer stackup of ground-signal-ground-ground-signal-ground.

In addition to extra card layers for ground shielding planes, FIG. 17 shows and added feature whereby contact pads on internal layers are designed to contact the receptacle fingers.

Figure 18:
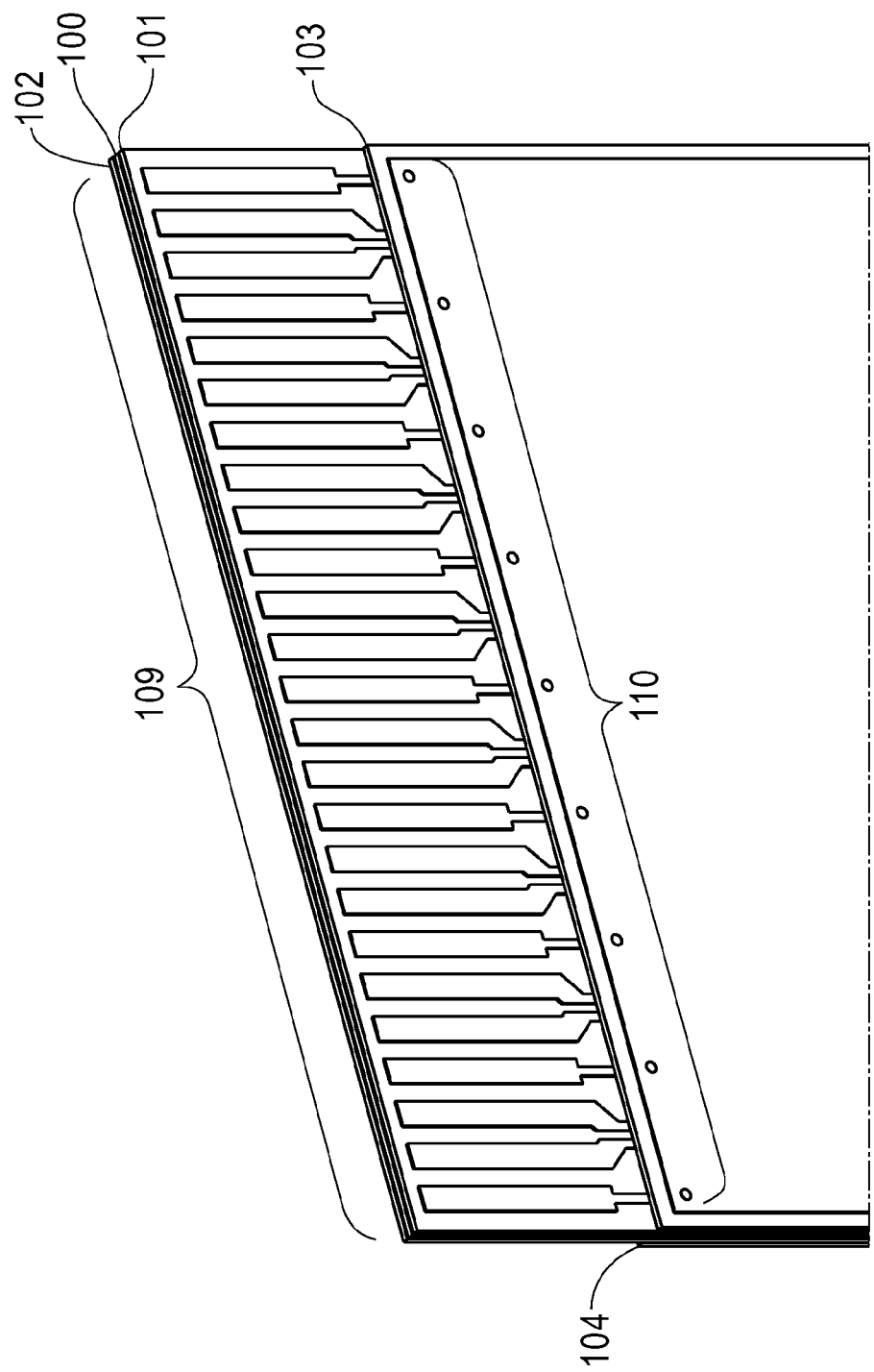
FIG. 18 is a close-up view of the terminal end of the wafer circuit card depicted in FIG. 17.

FIG. 18 is a close-up view of the detail of the ground-signal-ground-ground-signal-ground card depicted in FIG. 17 with elements 100 through 104, wafer circuit card pads 109, and vias 110. Note in FIG. 17 that the added cores 103 and 104 do not cover the entire area of the circuit card. This is not usually done in present day circuit card manufacturing, but a method for doing this process is explained in U.S. Pat. No. 7,326.857, the contents of which are incorporated by reference herein.

Figure 19:
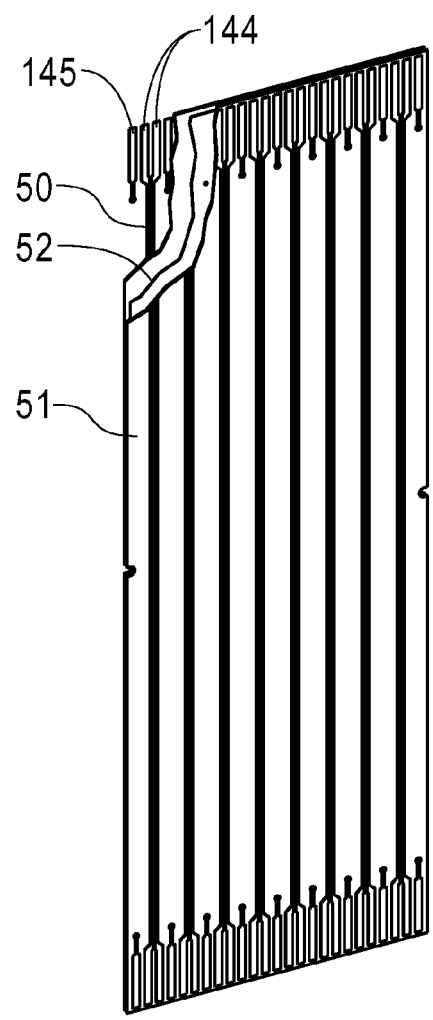
FIG. 19 is a plan partially cutaway view of the front and elements positioned on the back side of a wafer circuit card embodiment used in accordance with the present invention designated as a "signal-ground-signal card."

FIG. 19 depicts an embodiment similar to that depicted in FIG. 12-14. This is known in the art as a "three signal layer card." It contains three copper etched surfaces, two of which in this example are signal layers and one being a ground layer is assembled using a different manufacturing process from that described above. FIG. 19 depicts a card with a pair of signal pads 144 and ground pad 145 and signal pair 50 on one copper etch layer, a ground copper etch layer 52 and signal pads, ground pads and signal pairs on copper etch layer 51.

The embodiments depicted in FIGS. 12 through 18 always provides an even number of copper layers, although copper etch can always be omitted on one or more layers thus it is not necessary to have an even number of copper layers. The embodiment depicted in FIG. 19 uses another process or the same process with additional steps to eliminate one of the copper etches.

Figure 20:
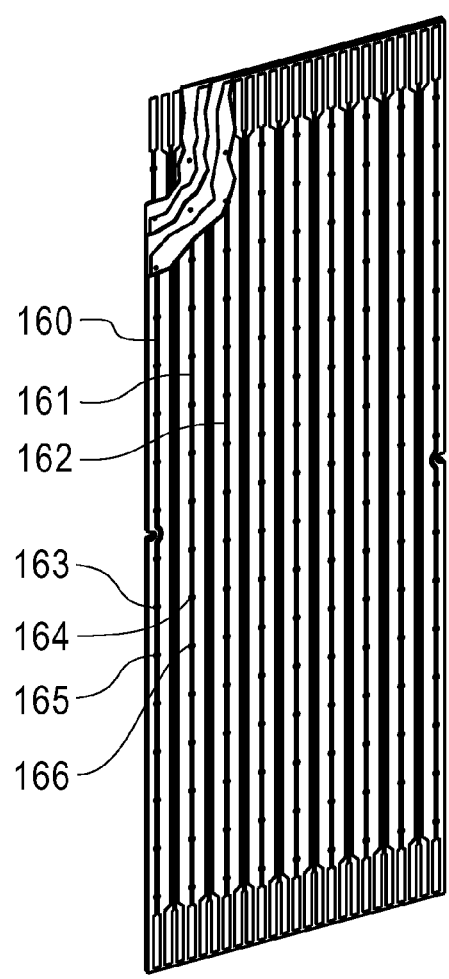
FIG. 20 depicts a wafer circuit card with a cutaway corner showing plurality of ground lines connecting upper and lower ground pads on signal layers and via stitching ground lines.

FIG. 20 depicts a circuit card with a cutaway corner showing plurality of ground lines illustrated by lines 160, 161, 162 connecting upper and lower ground pads on signal layers. The embodiment of FIG. 20 also illustrates vias 163, 164, 165 and 166 stitching ground lines to ground planes. This "enhancement" for the "ground lines on signal layers enhancement" can be applied to all of the embodiments disclosed above. The ground lines on the signal layers provide extra electrical isolation between signal lines and extra protection against cross talk between signal pairs. The vias stitching the ground lines to the planes ensures that the isolating lines are indeed well connected to ground electrical potential, thereby reducing induced noise voltages in the grounding structure. This enhancement would be used in circuits requiring a higher level of cross talk protection. The trade-off is the extra cost of the many vias necessary on each ground line in order to keep the ground lines at a reasonably constant potential.

FIGS. 12 to 20 and the descriptions provided therefore relate to various embodiments of wafer circuit cards which are manufactured by standard circuit card technology. The cards are thin on the order of 0.5 to 1 millimeter, depending on how many layers make up the card, in order to allow the connector to be compliant in one direction. The connector is compliant in the orthogonal direction by means of the card edge connector.

There are additional embodiments that can be used with respect to the circuit board etc. of the present invention. First, one can remove the metal from one face of a core; then the resulting single-metal-layer core and another core are secured together with a very thin fill. The result is a 3-layer core which can then be alternated with regular fills to create a multi-layer circuit board. This method can be used in an embodiment to create a ground-signal-ground-signal-ground five-layer card this way, using a 3-layer core plus plating on outer fills.

Alternatively, one can use multi-chip module build-up technology, where outer layers are sequentially added to a central two-layer core.

While all of the fundamental characteristics and features of the present apparatus of the disclosed invention have been described herein, with reference to particular embodiments thereof, a latitude of modification, various changes and substitutions are intended in the foregoing disclosure and it will be apparent that in some instance, some features of the invention will be employed without a corresponding use of other features without departing from the scope of the invention as set forth. It should be understood that any such substitutions, modifications, and variations may be made by those skilled in the art without departing from the spirit or scope of the invention. Consequently, all such modifications and variations are included within the scope of the invention as defined by the following claims.

What we claim and desire to protect by Letters Patent is:

1. An improved tall mezzanine connector assembly comprising means for connecting at least two electronic circuit boards, at any location along faces possessed by said circuit boards, said connector assembly means comprising:
a wafer assembly and a pair of receptacle assemblies;
said wafer assembly comprising at least one wafer circuit card,
said wafer circuit card comprising at least one core comprising of a cured sheet of dielectric and optionally one or more metal layers are adhered to said sheet of dielectric, said wafer assembly having at least one signal conductor extending from a first terminal end of said wafer circuit card to a second terminal end of said wafer circuit card;

means for providing a return current path conductor with controlled electrical impedance;

means for contacting said signal and said return current conductors on said wafer circuit card on to each of said receptacle assemblies;

means on said receptacle assemblies for contacting said electronic circuit boards.

2. The tall mezzanine connector assembly defined in claim 1, which each of whose wafer circuit cards contains a single core with two metal layers, two outer fill dielectric sheets and exterior metal plating on an outside surface of said fills, wherein current conduction is provided by said metal layers on said core or by said exterior metal plating.

3. The improved tall mezzanine connector assembly defined in claim 1 wherein each said wafer circuit card comprises more than one core and multiple fills to separate said cores.

4. The tall mezzanine connector assembly defined in claim 1 which uses a coreless buildup technology to create an alternating dielectric-metal structure of said connector's wafer circuit card.

5. The improved tall mezzanine connector assembly defined in claim 1 wherein said wafer assembly comprises at least one circuit card comprising a plurality of layers, said circuit card having a front, a back, two vertical sides connecting said front to said back, a top face and a bottom face;

one or more cores formed from a dielectric material having a plurality of etched electrically conductive parallel circuit signal lines extending substantially from said front of said core to substantially said back of said core external metal plating on the outside of top and bottom surface fills on said the front face and said rear face of said card; the plating having a plurality of etched electrically conductive parallel circuit signal lines extending substantially from said front of said card to said back of said card, each said signal line extending between and being in contact with a wafer circuit card contact pad located at said front and said back of said top or bottom external metal plating layer;

a plurality of first ground lines extending downward from said front of said card to a first set of vias and a plurality of second ground lines extending upward from said back of said card to a second set of vias, said ground lines and said vias being in parallel alignment with said signal lines and said wafer circuit card contact pads.

6. The improved tall mezzanine connector assembly defined in claim 5 wherein said receptacle assembly is a container comprising four continuous interconnected sides and an unexposed surface normal to said sides comprising a plurality of ribs forming slots adapted to receive said terminal ends of said wafer circuit card;

and an exposed surface normal to said sides within said receptacle assembly comprising columns and rows of metal contacts adapted to contact an electronic circuit board.

7. The improved tall mezzanine connector assembly defined in claim 6 wherein said plurality of columns and rows of receptacle contact fingers within said receptacle assembly are molded in a plastic frame which is fitted into said container; said receptacle contact fingers are configured at a first end thereof to contact and secure said terminal ends at said unexposed surface of said receptacle assembly as edge connectors of the wafer assemblies;

said receptacle contact fingers are at an opposite end of and an integral part of said metal contacts.

8. The improved tall mezzanine connector assembly defined in claim 7 wherein said metal contact fingers comprise a crook neck configuration at said exposed area, continuously extending through said plastic frame into said container and extending through a mid-element length and terminating as receptacle contact fingers at said unexposed area of said receptacle assembly.

9. The improved tall mezzanine connector assembly defined in claim 8 wherein each terminal end of one or more four wafer circuit cards are inserted into a slot in a receptacle assembly positioned at each said terminal end and said wafer circuit cards are held in place by circuit card holders contiguous with said two vertical sides of said wafer circuit cards.

10. An improved tall mezzanine connector assembly comprising means for connecting at least two electronic circuit boards, at any location along said faces of said circuit boards, said connector assembly means comprising:

a plurality of wafer assemblies comprising a plurality of wafer circuit cards wherein one or more metal layers are adhered to a cured sheet of dielectric;

a pair of receptacle assemblies having contacting means in contact with each said wafer circuit card in said plurality of wafer circuit card assemblies;

said wafer circuit card assembly comprising at least one core signal conductor layer line in a core for current conduction, and fills to separate multiple core layers;

said signal card having a plurality of signal conductors extending from a first terminal end of said wafer circuit card to a second terminal end of said wafer circuit card;

ground means for providing a return current path with controlled electrical impedance;

means for contacting said signal conductor on said wafer circuit card on to each of said receptacle assemblies;

means on said receptacle assemblies for contacting said electronic circuit boards.

11. The tall mezzanine connector assembly defined in claim 10 each of whose wafer circuit cards comprises two fills with copper etch on an external surface of each said fill, and a two sided core having copper etch on both sides, said fills each having a plurality of signal lines on an exterior side, said fills being positioned back-to-back and separated from each other by said core.

12. The tall mezzanine connector assembly defined in claim 11 each of whose wafer circuit cards is a signal-ground-ground-signal card.

13. The tall mezzanine connector assembly defined in claim 10 each of whose wafer circuit cards comprises a pair of fills and a core, a first fill having a copper return layer on an exposed surface, said core having copper etch signal lines on a first surface thereof and return current or ground layer copper etch on a second surface, a second fill having copper etch signal lines on its exposed surface.

14. The tall mezzanine connector assembly defined in claim 13, each of whose wafer circuit cards is a ground-signal-ground-signal card.

15. The tall mezzanine connector assembly defined in claim 10 each of whose wafer circuit cards comprises a first fill having an exterior with an electrical return plane etched on its external surface and contiguous with a first core having copper etch signal lines on a first side and an electrical return plane on a second side, a second core having a ground plane on a first side and copper etch signal lines on a second side, a fill separating said first core and said second core, and a second fill having an electrical return plane etched on its external surface and in contiguous contact with said second core.

16. The tall mezzanine connector assembly defined in claim 15, each of whose wafer circuit cards is a ground-signal-ground-ground-signal-ground card.

17. The tall mezzanine connector assembly defined in claim 15 each of whose wafer circuit cards has a central composite core formed from a first subcore having two outer metal layers affixed directly, or with a thin fill, to a second subcore having a single metal layer on the surface thereof facing away from said first subcore, said composite core thus containing three metal layers, and each wafer circuit contains two outer fills whose exposed faces possess metal plating thereon with unexposed sides contiguously contacting said three-layer core resulting in a card having five metal layers and wherein each of whose wafer circuit cards is a ground-signal-ground-signal-ground five-layer card forming a ground-signal-ground-signal-ground five-layer card.

18. The tall mezzanine connector assembly defined in claim 15 each of whose wafer circuit cards contains a single core having a metal layer on only one face, said metal layer being an electrical return plane, said core separating two fills, each said fill with copper etch signal lines plated onto the external surface of each said fill, together forming a three layer card.

19. The tall mezzanine connector assembly defined in claim 18 each of whose wafer circuit cards is signal- ground-signal card.

20. A wafer circuit card comprising one or more cores and one or more fills, said core comprising a planar sheet of dielectric having top and bottom faces, etched electrical circuits on one or both of said top and bottom faces; a fill comprising a sheet of dielectric without outer copper plating, said cores and fills being adhered together placed in alternating arrangement, wherein said core is selected from the group consisting of a dielectric with etched copper circuits on one face and without copper on the second face, a return plane on one face and no copper on the second face, etched copper electrical circuits on both faces, return planes on both faces, signal lines on both faces, signal lines on one face and a return plane on the other face, and a mixture of signal and return on each face.

21. An improved tall mezzanine connector assembly comprising:
  a wafer assembly having at least one wafer circuit card having terminal ends, said terminal ends containing wafer circuit card separable interface connector pads, a top receptacle and a bottom receptacle connected to said wafer circuit card,
  said wafer circuit card comprising a core layer and a fill layer,
  said core layer of said wafer circuit card comprising a dielectric with at least one etched metal layer electrical circuit on both sides thereof and said fill layer comprising a single dielectric with no etched metal layer circuit thereon,
  said core layers and said fill layers contacting one another and alternately placed back-to-back in various combinations to form said wafer assembly;
  each of said top and bottom receptacle assemblies has an unexposed side having a planar surface that contains at least one slot to receive said separable interface connector pads at said terminal end of said wafer circuit card,
  each of said top and bottom receptacle assemblies has an exposed side having a planar exterior surface that contains metal contacts that are at the opposite end of and an integral part of receptacle contact fingers positioned within said receptacle assemblies, said receptacle assembly metal contacts contacting a system circuit board having conducting contact means to provide a face-to-face, mechanically compliant, electrically high-speed signal connection between two system circuit boards,
  said improved tall mezzanine connector assembly:
  being positioned orthogonal to said two system circuit boards which are positioned parallel to each other;
  being flexible to connect said parallel two system circuit boards at any location along said circuit boards, wherein contacts in said parallel two system circuit boards are in vertical and non-vertical alignment with each other;
  having sufficient height to permit a plurality of daughter circuit cards having stack heights greater than 50 mm and less than 50 mm to connect to a system circuit board.

* * * * *